US012733147B2

(12) United States Patent
Sung et al.

(10) Patent No.: US 12,733,147 B2
(45) Date of Patent: Sep. 8, 2026

(54) SEMICONDUCTOR DEVICE AND METHOD FOR FABRICATING THE SAME

(71) Applicant: SK hynix Inc., Gyeonggi-do (KR)

(72) Inventors: Min Chul Sung, Gyeonggi-do (KR); Seiyon Kim, Gyeonggi-do (KR); Yangsung Joo, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 510 days.

(21) Appl. No.: 17/844,941

(22) Filed: Jun. 21, 2022

(65) Prior Publication Data

US 2023/0164977 A1 May 25, 2023

(30) Foreign Application Priority Data

Nov. 19, 2021 (KR) ........................ 10-2021-0160342

(51) Int. Cl.
*H10B 12/00* (2023.01)
*H10D 30/01* (2025.01)
*H10D 30/67* (2025.01)

(52) U.S. Cl.
CPC .......... *H10B 12/315* (2023.02); *H10B 12/03* (2023.02); *H10B 12/482* (2023.02);
(Continued)

(58) Field of Classification Search
CPC .... H10B 12/315; H10B 12/03; H10B 12/482; H10B 12/488; H10B 12/50; H10D 30/031; H10D 30/017; H10D 30/019–0198; H10D 30/0312; H10D 30/01; H10D 30/6713; H10D 30/6755; H10D 30/6757;
(Continued)

(56) References Cited

U.S. PATENT DOCUMENTS

| | | | | |
|---|---|---|---|---|
| 9,698,272 B1 * | 7/2017 | Ikeda | .................. | H10D 86/481 |
| 2006/0113587 A1 * | 6/2006 | Thies | ...................... | G11C 7/18 257/E21.655 |

(Continued)

FOREIGN PATENT DOCUMENTS

| | | |
|---|---|---|
| CN | 104795399 A | 7/2015 |
| CN | 112018190 A | 12/2020 |

(Continued)

OTHER PUBLICATIONS

Office Action for Korean Patent Application No. 10-2021-0160342 issued by the Korean Intellectual Property Office (KIPO) on Jul. 10, 2025.

(Continued)

*Primary Examiner* — Matthew C Landau
*Assistant Examiner* — David W Ward
(74) *Attorney, Agent, or Firm* — IP&T GROUP LLP

(57) ABSTRACT

A semiconductor device includes: a bit line; an oxide semiconductor pillar extending vertically from the bit line; a capacitor over the oxide semiconductor pillar; and a word line disposed over a sidewall of the oxide semiconductor pillar, wherein the oxide semiconductor pillar includes: a lower oxide semiconductor interface layer coupled to the bit line; an upper oxide semiconductor interface layer coupled to the capacitor; and an oxide semiconductor channel layer between the lower oxide semiconductor interface layer and the upper oxide semiconductor interface layer.

21 Claims, 32 Drawing Sheets

(52) U.S. Cl.
CPC ........... *H10B 12/488* (2023.02); *H10B 12/50* (2023.02); *H10D 30/031* (2025.01); *H10D 30/6713* (2025.01); *H10D 30/6755* (2025.01); *H10D 30/6757* (2025.01)

(58) Field of Classification Search
CPC ....... H10D 30/501–509; H10D 30/674; H10D 30/6728; H10D 30/0318
See application file for complete search history.

(56) References Cited

U.S. PATENT DOCUMENTS

| | | | | |
|---|---|---|---|---|
| 2007/0045741 | A1 | 3/2007 | Forbes | |
| 2008/0150012 | A1* | 6/2008 | Thies | G11C 7/02 257/E27.06 |
| 2012/0153365 | A1* | 6/2012 | Sung | H10D 62/393 257/288 |
| 2012/0181606 | A1* | 7/2012 | Nagai | H10B 12/01 257/334 |
| 2013/0043525 | A1 | 2/2013 | Yu et al. | |
| 2015/0200200 | A1* | 7/2015 | Sakuma | H10D 30/694 257/324 |
| 2017/0040458 | A1* | 2/2017 | Miyanaga | H10D 30/673 |
| 2018/0182783 | A1* | 6/2018 | Qin | H01L 23/3171 |
| 2019/0287977 | A1* | 9/2019 | Lee | H10B 12/053 |
| 2019/0304832 | A1* | 10/2019 | Sukekawa | H01L 21/76256 |
| 2019/0348419 | A1 | 11/2019 | Tang et al. | |
| 2021/0028176 | A1* | 1/2021 | Derner | H10B 12/312 |
| 2022/0085023 | A1* | 3/2022 | Shin | H10B 12/03 |
| 2022/0130832 | A1* | 4/2022 | Tsai | H10B 12/312 |
| 2022/0285557 | A1* | 9/2022 | Sugimoto | H01L 21/02565 |

FOREIGN PATENT DOCUMENTS

| | | | | |
|---|---|---|---|---|
| JP | 2020-198343 | A | 12/2020 | |
| KR | 10-2012-0084760 | A | 7/2012 | |
| KR | 10-2018-0130581 | A | 12/2018 | |
| KR | 10-2020-0101716 | A | 8/2020 | |
| TW | 201436210 | A | 9/2014 | |
| WO | 2020/042253 | A1 | 3/2020 | |
| WO | WO-2021106810 | A1 * | 6/2021 | C23C 16/4481 |

OTHER PUBLICATIONS

Office Action for Taiwanese Patent Application No. 111142799 issued by the Taiwanese Patent Office on Feb. 24, 2026.

Office Action for Chinese Patent Application No. 202211399394.3 issued by the Chinese Patent Office on Mar. 31, 2026.

* cited by examiner 200M
130
MCA_U
TR
127
126
123
125
124U
120
121
124
124L
122
111
110
102
136
135
134
136
133
130
132
136
135
131
MCA_L
127
TR
126
123
125
124U
120
121
124
124L
122
111
110
102
101

SEMICONDUCTOR DEVICE AND METHOD FOR FABRICATING THE SAME

CROSS-REFERENCE TO RELATED APPLICATIONS

The present application claims priority of Korean Patent Application No. 10-2021-0160342, filed on Nov. 19, 2021, which is incorporated herein by reference in its entirety.

BACKGROUND

1. Field

Embodiments of the present invention relate to a semiconductor device, and more particularly, to a semiconductor device including a bit line and a method for fabricating the semiconductor device.

2. Description of the Related Art

To fabricate highly integrated semiconductor devices, a transistor having a vertical channel has been proposed.

A vertical channel transistor using monocrystalline silicon as a channel has limitation in the degree of integration. Also, its electrical characteristics are deteriorated due to gate-induced drain leakage (GIDL) occurring in an overlapping region between a source/drain and a gate and junction leakage of a PN junction.

SUMMARY

Embodiments of the present invention are directed to a highly integrated semiconductor device, and a method for fabricating the semiconductor device.

In accordance with an embodiment of the present invention, a semiconductor device includes: a bit line; an oxide semiconductor pillar extending vertically from the bit line; a capacitor disposed over the oxide semiconductor pillar; and a word line disposed over a sidewall of the oxide semiconductor pillar, wherein the oxide semiconductor pillar includes: a lower oxide semiconductor interface layer coupled to the bit line; an upper oxide semiconductor interface layer coupled to the capacitor; and an oxide semiconductor channel layer disposed between the lower oxide semiconductor interface layer and the upper oxide semiconductor interface layer.

In accordance with another embodiment of the present invention, a semiconductor device includes: a substrate; a peripheral circuit portion disposed over the substrate; and a memory cell array including a bit line, a transistor, and a memory element that are vertically stacked over the peripheral circuit portion, wherein the transistor includes: an oxide semiconductor channel layer disposed between the bit line and a memory element; a tapered vertical word line disposed over a sidewall of the oxide semiconductor channel layer; a lower oxide semiconductor interface layer between the bit line and the oxide semiconductor channel layer; and an upper oxide semiconductor interface layer disposed between the capacitor and the oxide semiconductor channel layer.

In accordance with yet another embodiment of the present invention, a method for fabricating a semiconductor device includes: forming a bit line over a substrate; forming an oxide semiconductor pillar by stacking a lower interface layer, an oxide semiconductor channel layer, and an upper interface layer over the bit line in the recited order; forming a word line on a sidewall of the oxide semiconductor pillar; and forming a capacitor over the oxide semiconductor pillar.

In accordance with still another embodiment of the present invention, a semiconductor device includes: a first conductive line; an oxide semiconductor pillar extending vertically from the first conductive line; a memory element disposed over the oxide semiconductor pillar; and a second conductive line disposed over a sidewall of the oxide semiconductor pillar, wherein the oxide semiconductor pillar includes: a lower oxide semiconductor interface layer coupled to the first conductive line; an upper oxide semiconductor interface layer coupled to the memory element; and an oxide semiconductor channel layer disposed between the lower oxide semiconductor interface layer and the upper oxide semiconductor interface layer.

In accordance with another embodiment of the present invention, a vertical channel transistor includes: a lower oxide semiconductor interface layer; an upper oxide semiconductor interface layer; an oxide semiconductor channel layer extending vertically between the lower oxide semiconductor interface layer and the upper oxide semiconductor interface layer; and a tapered vertical gate disposed over a sidewall of the oxide semiconductor channel layer. The oxide semiconductor channel layer may include IGZO, ITZO or ZTO, and the lower oxide semiconductor interface layer and the upper oxide semiconductor interface layer may include indium-rich IGZO.

DETAILED DESCRIPTION

Figure 1A:
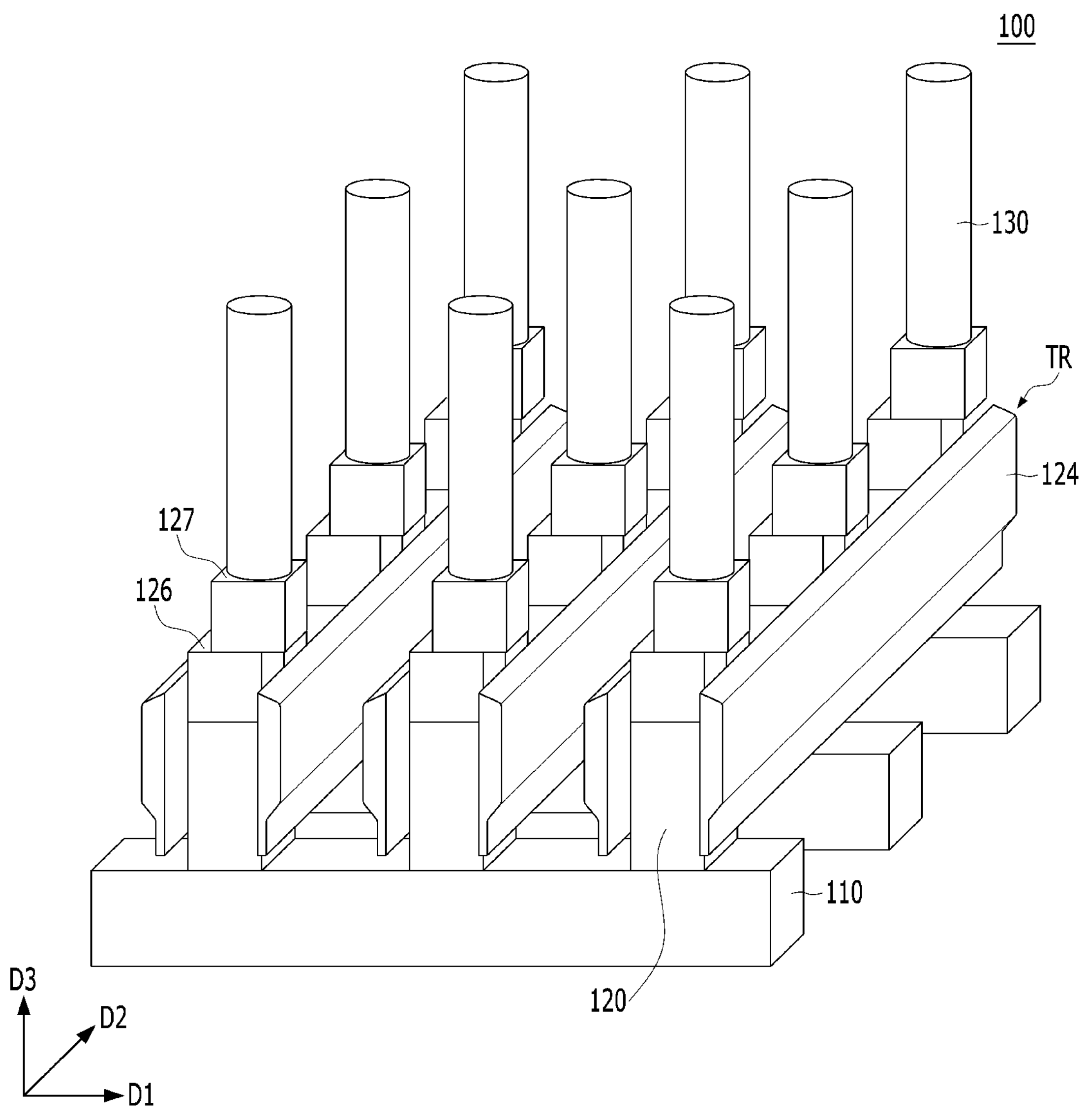
FIG. 1A is a schematic perspective view illustrating a semiconductor device.

Embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being “on” a second layer or “on” a substrate, it not only refers to a case where the first layer is formed directly on the second layer or the substrate but also a case where a third layer exists between the first layer and the second layer or the substrate.

Figure 1B:
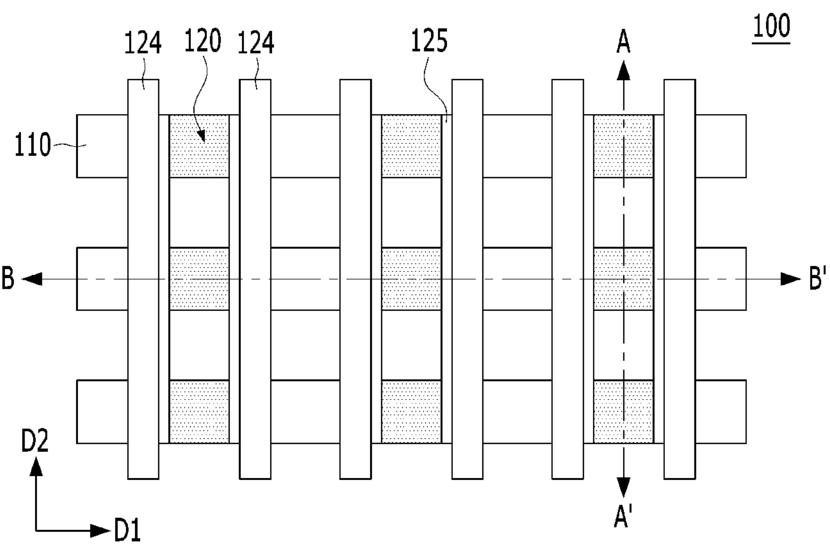
FIG. 1B is a schematic plan view illustrating the semiconductor device of FIG. 1A.
Figure 1C:
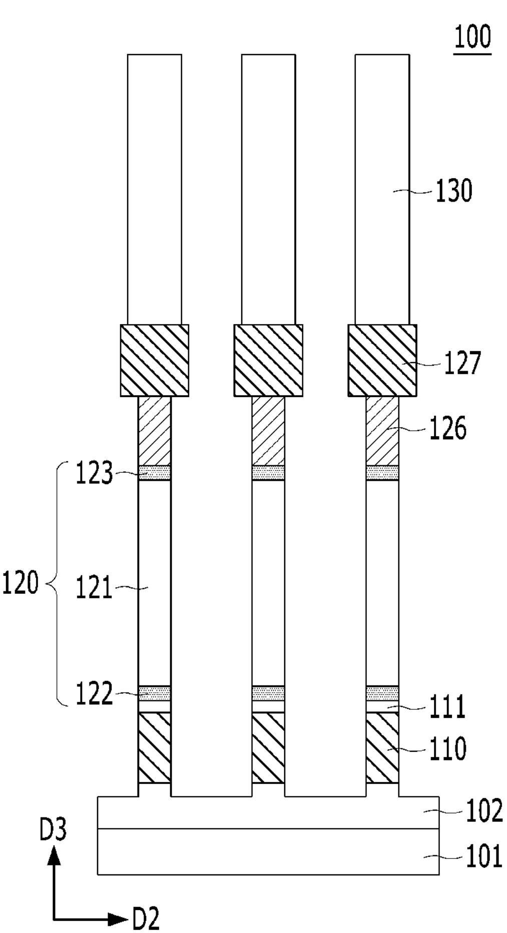
FIG. 1C is a cross-sectional view taken along a line A-A' shown in FIG. 1B.
Figure 1D:
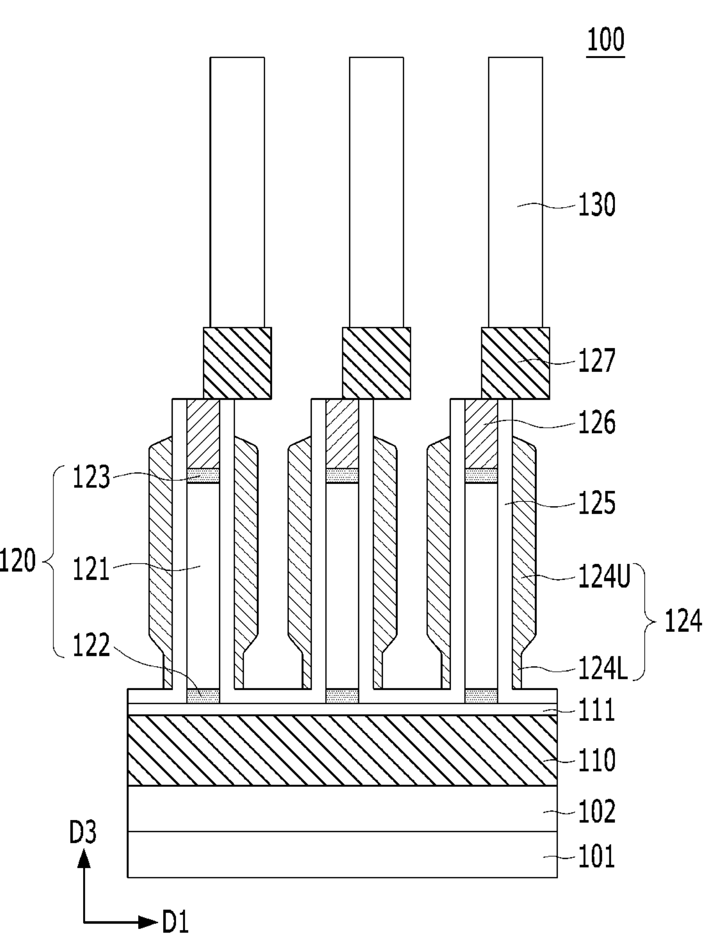
FIG. 1D is a cross-sectional view taken along a line B-B' shown in FIG. 1B.
Figure 1E:
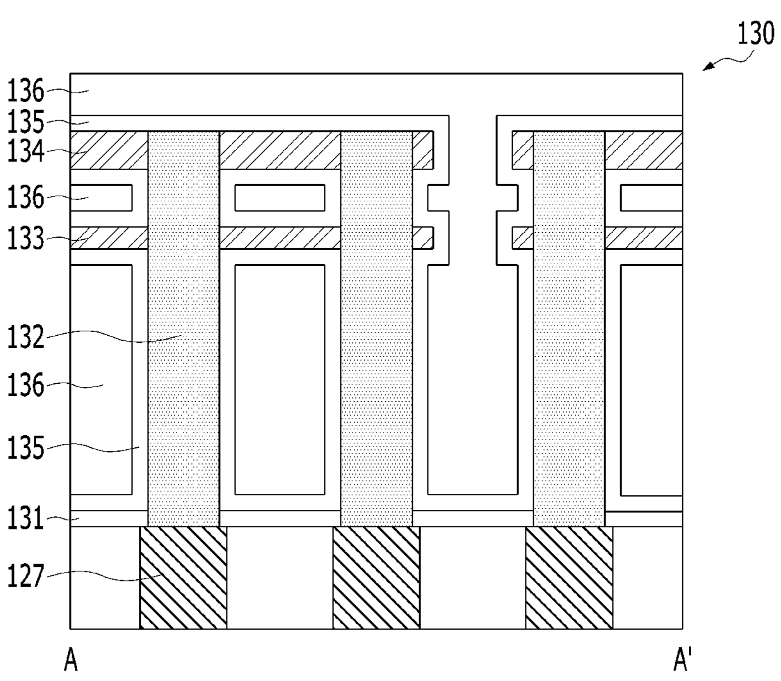
FIG. 1E is a detailed cross-sectional view illustrating a capacitor.

FIG. 1A is a schematic perspective view illustrating a semiconductor device. FIG. 1B is a schematic plan view illustrating the semiconductor device. FIG. 1C is a cross-sectional view taken along a line A-A' shown in FIG. 1B. FIG. 1D is a cross-sectional view taken along a line B-B' shown in FIG. 1B. FIG. 1E is a detailed cross-sectional view illustrating a capacitor 130.

Referring to FIGS. 1A to 1E, the semiconductor device 100 may include a plurality of first conductive lines 110, a plurality of oxide semiconductor pillars 120 vertically extending from the first conductive lines 110, a plurality of memory elements 130 formed over the oxide semiconductor pillars 120, and a plurality of second conductive lines 124 disposed over the respective sidewalls of the oxide semiconductor pillars 120. Each oxide semiconductor pillar 120 may include a lower interface layer 122 coupled to the first conductive line 110, an upper interface layer 123 coupled to the memory element 130, and an oxide semiconductor channel layer 121 disposed between the lower interface layer 122 and the upper interface layer 123. The lower interface layer 122 and the upper interface layer 122 may include an oxide semiconductor layer. The lower interface layer 122 and the upper interface layer 123 may be referred to as a lower oxide semiconductor interface layer and an upper oxide semiconductor interface layer, respectively.

The semiconductor device 100 may include a Dynamic Random Access Memory (DRAM), and the first conductive lines 110 and the second conductive lines 124 may correspond to bit lines and word lines, respectively. The memory elements 130 may correspond to capacitors. Hereinafter, the first conductive lines 110 and the second conductive lines 124 may be simply referred to as bit lines 110 and word lines 124, respectively, and the memory elements 130 may be simply referred to as capacitors 130.

The semiconductor device 100 may include an oxide semiconductor channel layer 121, a bit line 110 disposed at a lower level than the oxide semiconductor channel layer 121, a capacitor 130 disposed at a higher level than the oxide semiconductor channel layer 121, a tapered vertical word line 124 disposed over a sidewall of the oxide semiconductor channel layer 121, a lower interface layer 122 between the bit line 110 and the oxide semiconductor channel layer 121, and an upper interface layer 123 between the capacitor 130 and the oxide semiconductor channel layer 121.

The semiconductor device 100 may be described in detail as follows.

The semiconductor device 100 may include a substrate 101, a buffer layer 102 over the substrate 101, a bit line 110 over the buffer layer 102, a vertical channel transistor TR over the bit line 110, and a capacitor 130 over the vertical channel transistor TR. The vertical channel transistor TR may include an oxide semiconductor pillar 120, a tapered vertical word line 124 disposed over both sidewalls of the oxide semiconductor pillar 120, and a gate dielectric layer 125 between the oxide semiconductor pillar 120 and the tapered vertical word line 124. The oxide semiconductor pillar 120 may include the oxide semiconductor channel layer 121, the lower interface layer 122 between the oxide semiconductor channel layer 121 and the bit line 110, and the upper interface layer 123 between the oxide semiconductor channel layer 121 and the capacitor 130. A barrier layer 111 may be disposed between the bit line 110 and the lower interface layer 122.

The semiconductor device 100 may further include first and second contact plugs 126 and 127 between the upper interface layer 123 and the capacitor 130.

The substrate 101 may be a material suitable for semiconductor processing. The substrate 101 may include a semiconductor substrate. The substrate 101 may be formed of a silicon-containing material. The substrate 101 may include silicon, monocrystalline silicon, polysilicon, amorphous silicon, silicon germanium, monocrystalline silicon germanium, polycrystalline silicon germanium, carbon-doped silicon, a combination thereof, or a multi-layer thereof. The substrate 101 may include other semiconductor materials such as germanium. The substrate 101 may include a III/V group semiconductor substrate, for example, a compound semiconductor substrate, such as GaAs. The substrate 101 may include a Silicon-On-Insulator (SOI) substrate.

The buffer layer 102 may include silicon oxide, silicon nitride, or a combination thereof. To reduce parasitic capacitance, the buffer layer 102 may be formed of silicon oxide. For example, the buffer layer 102 may include tetra ethyl ortho silicate (TEOS).

The bit line 110 may extend in a first direction D1 over the buffer layer 102. The bit line 110 may include a metal-based material. The bit line 110 may include a metal, a metal nitride, a metal silicide, or a combination thereof. The bit line 110 may have a thickness of approximately 100 to 400 Å. The bit line 110 may include a tungsten layer.

The barrier layer 111 may include a metal, a metal nitride, a metal silicide, or a combination thereof. The barrier layer 111 may include titanium nitride, molybdenum, or ruthenium. The barrier layer 111 may have a thickness of approximately 10 to 50 Å. For example, the barrier layer 111 may include a titanium nitride layer.

The lower interface layer 122 and the upper interface layer 123 may include an oxide semiconductor material having a lower resistance than the oxide semiconductor channel layer 121. The lower interface layer 122 and the upper interface layer 123 may include a metallic-rich oxide semiconductor material, and the oxide semiconductor channel layer 121 may include an oxygen-rich oxide semiconductor material. For example, the oxide semiconductor channel layer 121 may include indium gallium zinc oxide (IGZO), indium tin zinc oxide (ITZO), or zinc tin oxide (ZTO), and the lower interface layer 122 and the upper interface layer 123 may include indium-rich IGZO. Indium-rich IGZO may refer to a material with a higher indium content than gallium (Ga) and zinc (Zinc) in IGZO, for example, the content of indium may be approximately 40% or more.

The oxide semiconductor channel layer 121 may include an oxide semiconductor material. The oxide semiconductor channel layer 121 may contain indium. The oxide semiconductor channel layer 121 may include IGZO. The oxide semiconductor channel layer 121 may be formed to have a thickness of approximately 200 to 1000 Å.

The lower interface layer 122 may include an oxide semiconductor material. The lower interface layer 122 may contain indium. The lower interface layer 122 may include an indium-rich oxide semiconductor material. For example, the lower interface layer 122 may include indium-rich IGZO. The lower interface layer 122 may be formed to have a thickness of approximately 10 to 50 Å.

The upper interface layer 123 may include an oxide semiconductor material. The upper interface layer 123 may contain indium. The upper interface layer 123 may include an indium-rich oxide semiconductor material. For example, the upper interface layer 123 may include indium-rich IGZO. The upper interface layer 123 may be formed to have a thickness of approximately 10 to 50 Å.

As described above, the oxide semiconductor pillar 120 may extend vertically in a third direction D3 over the bit line 110. The oxide semiconductor pillar 120 may be vertically stacked over the bit line 110 in an order of the lower interface layer 122, the oxide semiconductor channel layer 121, and the upper interface layer 123. The lower interface layer 122, the oxide semiconductor channel layer 121, and the upper interface layer 123 may all include an oxide semiconductor material. The lower interface layer 122, the oxide semiconductor channel layer 121, and the upper interface layer 123 may all include IGZO, but the lower interface layer 122 and the upper interface layer 123 may have a higher indium concentration than the oxide semiconductor channel layer 121. The oxide semiconductor channel layer 121 may be IGZO, and the lower interface layer 122 and the upper interface layer 123 may be indium-rich IGZO. The lower interface layer 122, the oxide semiconductor channel layer 121, and the upper interface layer 123 may be referred to as an active pillar.

A tapered vertical word line 124 having a double structure may be disposed over a sidewall of the oxide semiconductor channel layer 121. The tapered vertical word line 124 and the bit line 110 may extend in directions crossing each other. The tapered vertical word line 124 may have a reverse tapered shape. The reverse tapered shape may refer to a shape the width of the bottom portion of which becomes gradually smaller than the width of the upper portion. For example, the tapered vertical word line 124 may include a lower level portion 124L which is adjacent to the bit line 110 and an upper level portion 124U which is adjacent to the capacitor 130. The thickness of the lower level portion 124L in the first direction D1 may be smaller than the thickness of the upper level portion 124U. The lower level portion 124L may be adjacent to the lower interface layer 122, and the upper level portion 124U may be adjacent to the upper interface layer 123. The lower level portion 124L and the upper level portion 124U may be formed of the same material. The lower level portion 124L and the bit line structure BL may be spaced apart from each other with a space. The lower level portion 124L of the tapered vertical word line 124 and the bit line structure BL may not contact each other.

The tapered vertical word line 124 may include a metal-based material. The tapered vertical word line 124 may include a metal, a metal nitride, or a combination thereof. The tapered vertical word line 124 may include tantalum nitride (TaN), titanium nitride (TiN), tungsten (W), tungsten nitride (WN), or a combination thereof.

A gate dielectric layer 125 may be formed between the tapered vertical word line 124 and the oxide semiconductor pillar 120. The gate dielectric layer 125 may include silicon oxide, silicon nitride, silicon oxynitride, a high-k material, or a combination thereof. The gate dielectric layer 125 may be disposed between the oxide semiconductor pillar 120 and the tapered vertical word line 124. The gate dielectric layer 125 may include a horizontal portion that extends to be disposed between the lower level portion 124L of the tapered vertical word line 124 and the bit line 110, and the horizontal portion of the gate dielectric layer 125 may directly contact the barrier layer 111. The oxide semiconductor pillar 120, the gate dielectric layer 125, and the tapered vertical word line 124 may form the vertical channel transistor TR. The tapered vertical word line 124 may be referred to as a tapered vertical gate.

The contact plugs 126 and 127 may include a first contact plug 126 and a second contact plug 127 over the first contact plug 126. The first contact plug 126 may directly contact the upper interface layer 123, and the second contact plug 127 may directly contact the capacitor 130. The first contact plug 126 and the second contact plug 127 may vertically overlap with each other. The first contact plug 126 and the second contact plug 127 may include a metal-based material. The first contact plug 126 and the second contact plug 127 may include a metal, a metal nitride, or a combination thereof. The first contact plug 126 and the second contact plug 127 may be formed of the same metal-based material. According to another embodiment of the present invention, the first contact plug 126 and the second contact plug 127 may be formed of different metal-based materials. Sidewalls of the first contact plugs 126 may be surrounded by the gate dielectric layer 125.

The capacitor 130 may include a lower electrode 132, a dielectric layer 135, and an upper electrode 136. The lower electrode 132 may be formed over the second contact plug 127. The lower electrode 132 may have a pillar shape. The lower electrodes 132 may be supported by the supporters 133 and 134. A sidewall of the bottom portion of the lower electrode 132 may contact the etch stop layer 131. According to another embodiment of the present invention, the lower electrodes 132 may have a cylindrical shape.

Although not illustrated, dielectric pillars may be disposed between the oxide semiconductor pillars 120 in the direction of the A-A'.

FIGS. 2A to 2K are cross-sectional views illustrating an example of a method for fabricating a semiconductor device in accordance with an embodiment of the present invention.

Figure 2A:
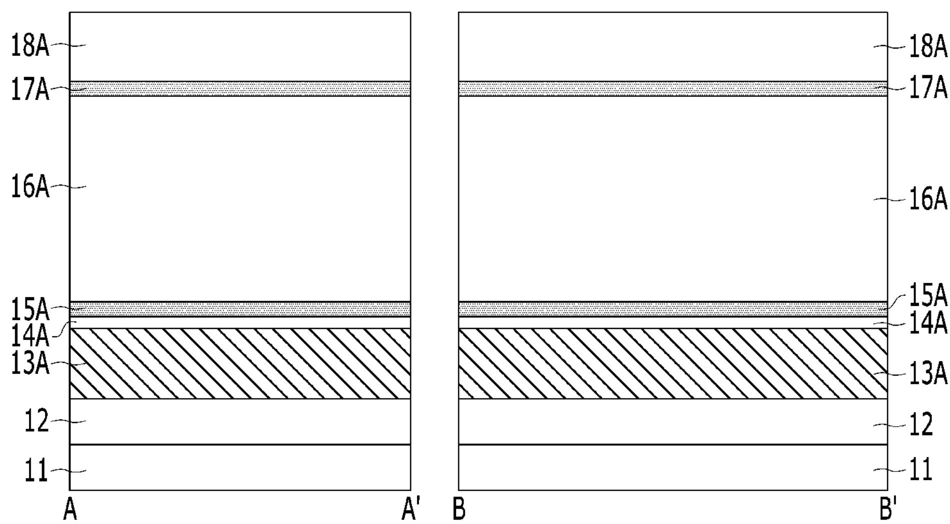
FIGS. 2A to 2K are cross-sectional views illustrating an example of a method for fabricating a semiconductor device in accordance with an embodiment of the present invention.

Referring to FIG. 2A, a buffer layer 12 may be formed over a substrate 11. The substrate 11 may be a material appropriate for semiconductor processing. The substrate 11 may include a semiconductor substrate. The substrate 11 may be formed of a silicon-containing material. The substrate 11 may include silicon, monocrystalline silicon, polysilicon, amorphous silicon, silicon germanium, monocrystalline silicon germanium, polycrystalline silicon germanium, carbon-doped silicon, a combination thereof, or a multi-layer thereof. The substrate 11 may include other semiconductor materials, such as germanium. The substrate 11 may include a III/V-group semiconductor substrate, for example, a compound semiconductor substrate, such as GaAs. The substrate 11 may include a Silicon-On-Insulator (SOI) substrate. The buffer layer 12 may include a dielectric material. The buffer layer 12 may include silicon oxide, silicon nitride, or a combination thereof.

A conductive layer 13A may be formed over the buffer layer 12. The conductive layer 13A may include a metal-based material. The conductive layer 13A may include a metal, a metal nitride, a metal silicide, or a combination thereof. The conductive layer 13A may be formed by atomic layer deposition (ALD), physical vapor deposition (PVD), or chemical vapor deposition (CVD). The conductive layer 13A may be formed to have a thickness of approximately 100 to 400 Å. For example, as for the conductive layer 13A, a tungsten layer may be deposited to have a thickness of approximately 200 Å by physical vapor deposition (PVD). In order to reduce parasitic capacitance between the substrate 11 and the conductive layer 13A, the buffer layer 12 may be formed of silicon oxide. For example, the buffer layer 12 may include tetra ethyl ortho silicate (TEOS).

A barrier material layer 14A may be formed over the conductive layer 13A. The barrier material layer 14A may include a metal-based material. The barrier material layer 14A may include a metal, a metal nitride, a metal silicide, or a combination thereof. The barrier material layer 14A may include titanium nitride, molybdenum, or ruthenium. The barrier material layer 14A may be formed by atomic layer deposition (ALD), physical vapor deposition (PVD), or chemical vapor deposition (CVD). The barrier material layer 14A may be formed to have a thickness of approximately 10 to 50 Å. For example, as for the barrier material layer 14A, titanium nitride may be deposited to have a thickness of approximately 20 Å by physical vapor deposition (PVD).

An oxide semiconductor stack may be formed over the barrier material layer 14A. For example, the oxide semiconductor stack may include a lower interface material layer 15A, a channel material layer 16A, and an upper interface material layer 17A.

A lower interface material layer 15A may be formed over the barrier layer 14A. The lower interface material layer 15A may include a conductive material. The lower interface material layer 15A may include an oxide semiconductor material. The lower interface material layer 15A may contain indium. The lower interface material layer 15A may include an indium-rich oxide semiconductor material. For example, the lower interface material layer 15A may include indium-rich IGZO. The lower interface material layer 15A may be formed to have a thickness of approximately 10-50 Å.

A channel material layer 16A may be formed over the lower interface material layer 15A. The channel material layer 16A may include a conductive material. The channel material layer 16A may include an oxide semiconductor material. The channel material layer 16A may contain indium. The channel material layer 16A may include IGZO. The channel material layer 16A may be formed to have a thickness of approximately 200 to 1000 Å.

An upper interface material layer 17A may be formed over the channel material layer 16A. The upper interface material layer 17A may include a conductive material. The upper interface material layer 17A may include an oxide semiconductor material. The upper interface material layer 17A may contain indium. The upper interface material layer 17A may include an indium-rich oxide semiconductor material. For example, the upper interface material layer 17A may include indium-rich IGZO. The upper interface material layer 17A may be formed to have a thickness of approximately 10 to 50 Å.

As described above, the lower interface material layer 15A, the channel material layer 16A, and the upper interface material layer 17A may be vertically stacked over the barrier material layer 14A. The lower interface material layer 15A, the channel material layer 16A, and the upper interface material layer 17A may all include an oxide semiconductor material. The lower interface material layer 15A, the channel material layer 16A, and the upper interface material layer 17A may all include IGZO, but the lower interface material layer 15A and the upper interface material layer 17A may have a higher indium concentration than the channel material layer 16A. The channel material layer 16A may be IGZO, and the lower interface material layer 15A and the upper interface material layer 17A may be indium-rich IGZO. As the lower interface material layer 15A and the upper interface material layer 17A contain a high concentration of indium, its resistance may be reduced lower than that of the channel material layer 16A. Also, channel seamless interconnection of the channel material layer 16A may be possible.

Subsequently, a sacrificial layer 18A may be formed over the upper interface material layer 17A. The sacrificial layer 18A may include a stack of different materials. The sacrificial layer 18A may include silicon nitride.

Figure 2B:
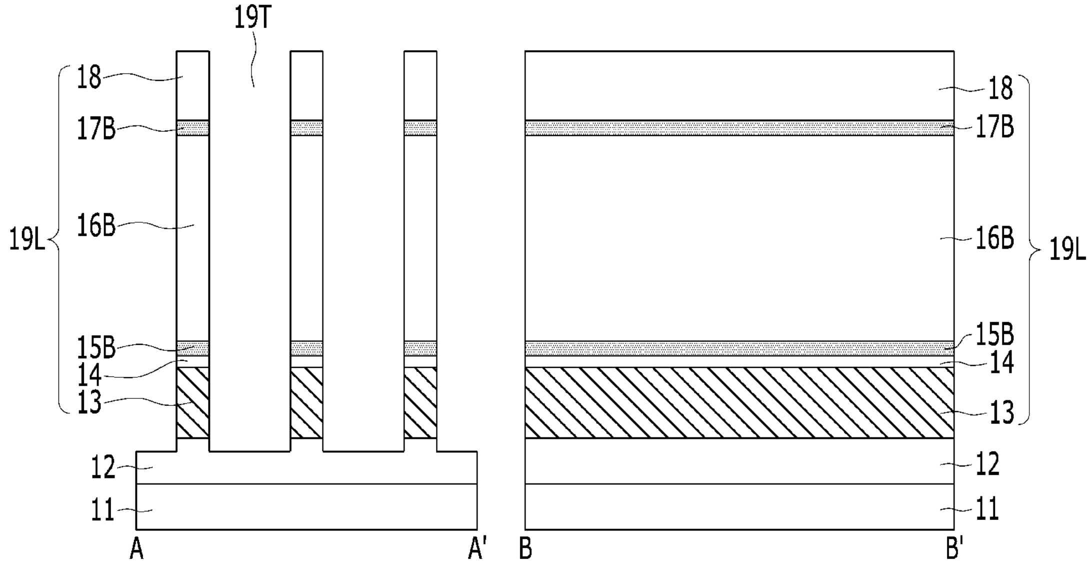

Referring to FIG. 2B, sacrificial lines 18 may be formed over the upper interface material layer 17A. The sacrificial lines 18 may be formed by etching the sacrificial layer 18A. The sacrificial lines 18 may serve to protect the lower interface material layer 15A, the channel material layer 16A, and the upper interface material layer 17A from the subsequent processes. For example, the sacrificial lines 18 may be used as an etch barrier during an etching process of the lower interface material layer 15A, the channel material layer 16A, and the upper interface material layer 17A.

Each of the sacrificial lines 18 may include a stack of different materials. The sacrificial lines 18 may include silicon nitride. The etching process of the sacrificial layer 18A to form the sacrificial lines 18 may include a double patterning process.

Subsequently, the upper interface material layer 17A, the channel material layer 16A, and the upper interface material layer 15A may be etched by using the sacrificial lines 18 as an etch barrier, and then the barrier material layer 14A and the conductive layer 13A may be etched.

A plurality of line structures 19L and first trenches 19T may be formed over the buffer layer 12 by a series of the etching processes described above. Each of the line structures 19L may include a stack of a bit line 13, a bit line barrier layer 14, a lower interface layer 15B, a channel material layer 16B, an upper interface layer 17B, and a sacrificial line 18. The bit line barrier layer 14 may be formed by etching the barrier material layer 14A, and the bit line 13 may be formed by etching the conductive layer 13A. The lower interface layer 15B, the channel material layer 16B, and the upper interface layer 17B may be formed by etching the lower interface material layer 15A, the channel material layer 16A, and the upper interface material layer 17A, respectively. The first trenches 19T may be disposed between the line structures 19L. The stack of the lower interface layer 15B, the channel material layer 16B, and the upper interface layer 17B may be referred to as an 'oxide semiconductor line'.

Figure 2C:
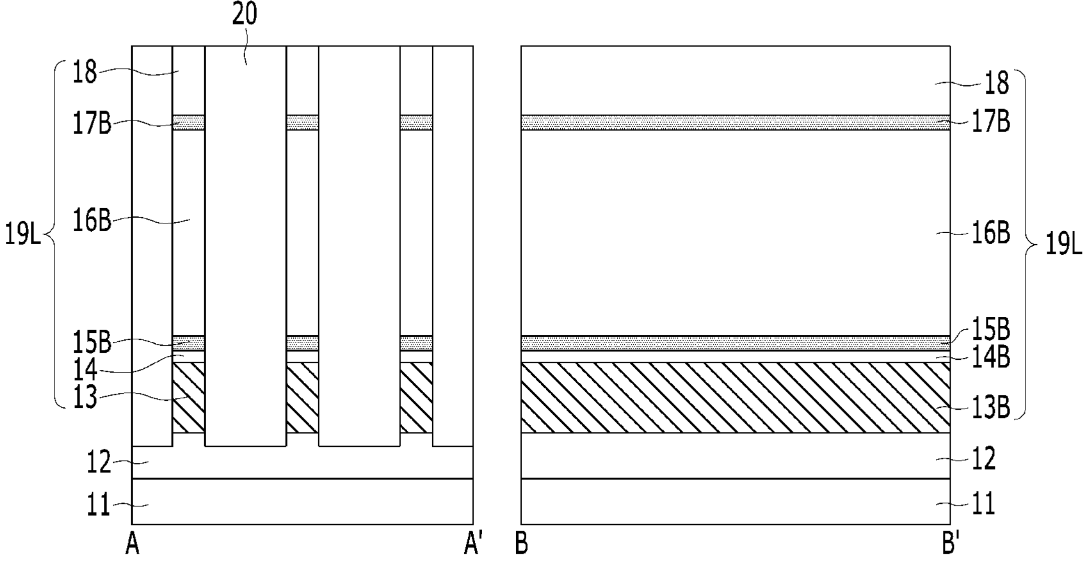

Referring to FIG. 2C, dielectric lines 20 may be formed between the line structures 19L. The dielectric lines 20 may include a dielectric material. For example, the dielectric lines 20 may include silicon oxide, silicon nitride, silicon carbon oxide (SiCO), spin-on-dielectric, or a combination thereof. After a dielectric material is deposited to fill the first trenches 19T between the line structures 19L to form the dielectric lines 20, a planarization process of the dielectric material may be performed. The dielectric lines 20 may fill the first trenches 19T, respectively. To form the dielectric lines 20, a planarization process may be performed after a silicon nitride, silicon carbon oxide, and a spin-on dielectric layer are sequentially formed.

Figure 2D:
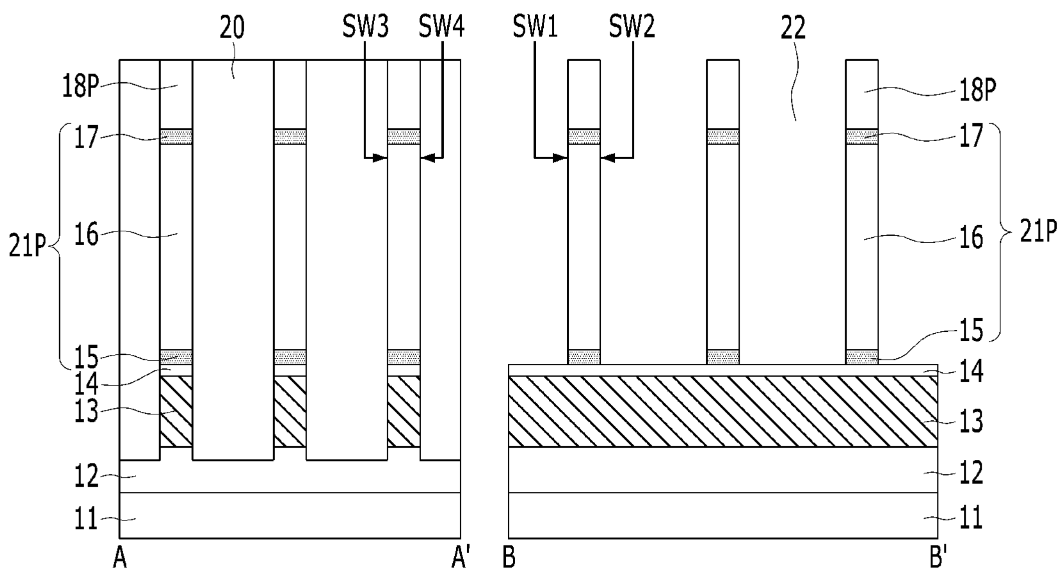

Referring to FIG. 2D, a portion of the line structures 19L may be selectively etched to form the sacrificial pillars 18P and the oxide semiconductor pillars 21P. A bit line barrier layer 14 and a bit line 13 may be disposed below the oxide semiconductor pillars 21P.

Each of the oxide semiconductor pillars 21P may include a stack of a lower interface layer 15, a channel layer 16, and an upper interface layer 17. The lower interface layer 15, the channel layer 16, and the upper interface layer 17 may be formed by etching the lower interface layer 15B, the channel material layer 16B, and the upper interface layer 17B, respectively. A sacrificial pillar 18P may be formed over the upper interface layer 17.

Second trenches 22 may be formed between the oxide semiconductor pillars 21P. The bottom surfaces of the second trenches 22 may expose the top surface of the bit line barrier layer 14. The first trenches 19T and the second trenches 22 may intersect with each other. The first trenches 19T may be deeper than the second trenches 22. In the direction of the line B-B', the dielectric lines 20 may be cut by the second trenches 22. Hereinafter, the dielectric lines 20 may be simply referred to as 'dielectric pillars 20'. The dielectric pillars 20 may be disposed between the oxide semiconductor pillars 21P in the direction of the line A-A'.

Each of the oxide semiconductor pillars 21P may include first to fourth sidewalls SW1 to SW4. A first sidewall SW1 and a second sidewall SW2 of the individual oxide semiconductor pillar 21P may be exposed by the second trenches 22, and a third sidewall SW3 and a fourth sidewall SW4 of the individual oxide semiconductor pillar 21P may not be exposed by the dielectric pillars 20. The sacrificial pillar 18P may also include exposed sidewalls and non-exposed sidewalls just as the oxide semiconductor pillar 21P.

Figure 2E:
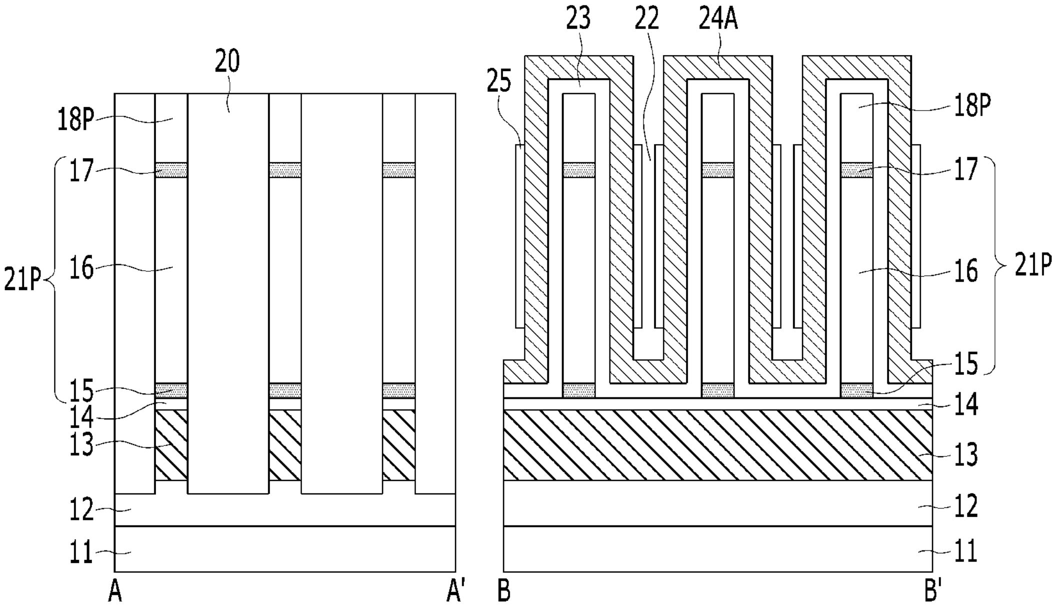

Referring to FIG. 2E, a gate dielectric layer 23 may be formed over the exposed first and second sidewalls SW1 and SW2 of the oxide semiconductor pillars 21P. The gate dielectric layer 23 may include silicon oxide, silicon nitride, silicon oxynitride, a high-k material, or a combination thereof. The high-k material may include a material having a higher dielectric constant than that of silicon oxide. For example, the high-k material may include a material having a dielectric constant which is greater than approximately 3.9. As another example, the high-k material may include a material having a dielectric constant which is greater than approximately 10. As another example, the high-k material may include a material having a dielectric constant of approximately 10 to 30. The high-k material may include at least one metallic element. The high-k material may include a hafnium-containing material. The hafnium-containing material may include hafnium oxide, hafnium silicon oxide, hafnium silicon oxynitride, or a combination thereof. According to another embodiment of the present invention, the high-k material may include lanthanum oxide, lanthanum aluminum oxide, zirconium oxide, zirconium silicon oxide, zirconium silicon oxynitride, aluminum oxide, or a combination thereof. As for the high-k material, other known high-k materials may be selectively used. The gate dielectric layer 23 may include a metal oxide. The gate dielectric layer 23 may be formed conformally over the first and second sidewalls SW1 and SW2 of the oxide semiconductor pillar 21P. The gate dielectric layer 23 may conformally cover the exposed sidewalls and the top surface of the sacrificial pillar 18P. The gate dielectric layer 23 and the lower interface layer 15 may have the same thickness. According to another embodiment of the present invention, the gate dielectric layer 23 may be thinner than the lower interface layer 15.

A word line conductive layer 24A may be formed over the gate dielectric layer 23. The word line conductive layer 24A may be conformally formed over the gate dielectric layer 23. The word line conductive layer 24A may include a metal-based material. The word line conductive layer 24A may include a metal, a metal nitride, or a combination thereof. The word line conductive layer 24A may include tantalum nitride (TaN), titanium nitride (TiN), tungsten (W), tungsten nitride (WN), or a combination thereof.

Spacers 25 may be formed over the word line conductive layer 24A. The spacers 25 may include an oxide. To form the spacers 25, an etch-back process may be performed after depositing silicon oxide over the word line conductive layer 24A. The upper surface of the spacers 25 may be disposed at a lower level than the upper surface of the sacrificial pillars 18P.

Figure 2F:
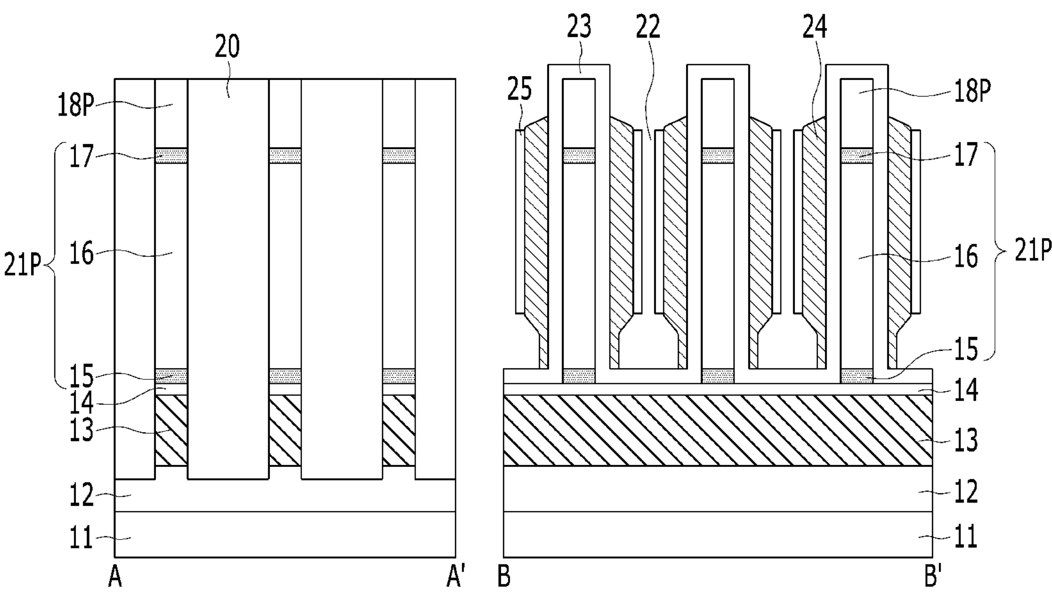

Referring to FIG. 2F, tapered vertical word lines 24 may be formed. In order to form the tapered vertical word lines 24, the word line conductive layer 24A may be selectively etched by using the spacers 25 as an etch barrier. The spacers 25 may serve to protect the tapered vertical word lines 24 during an etching process of the word line conductive layer 24A. In the etching process of the word line conductive layer 24A, an etch-back process and a wet etching process may be sequentially performed. Non-tapered vertical word lines may be formed by an etch-back process, and the tapered vertical word lines 24 may be formed by the subsequent wet etching process. In other words, the bottom portion of the tapered vertical word lines 24 may become thin by the wet etching process. The tapered vertical word lines 24 may correspond to the tapered vertical word lines 124 of FIGS. 1A, 1B, and 1D, and the bottom portion of the tapered vertical word lines 24 may correspond to the lower level portion 124L.

Figure 2G:
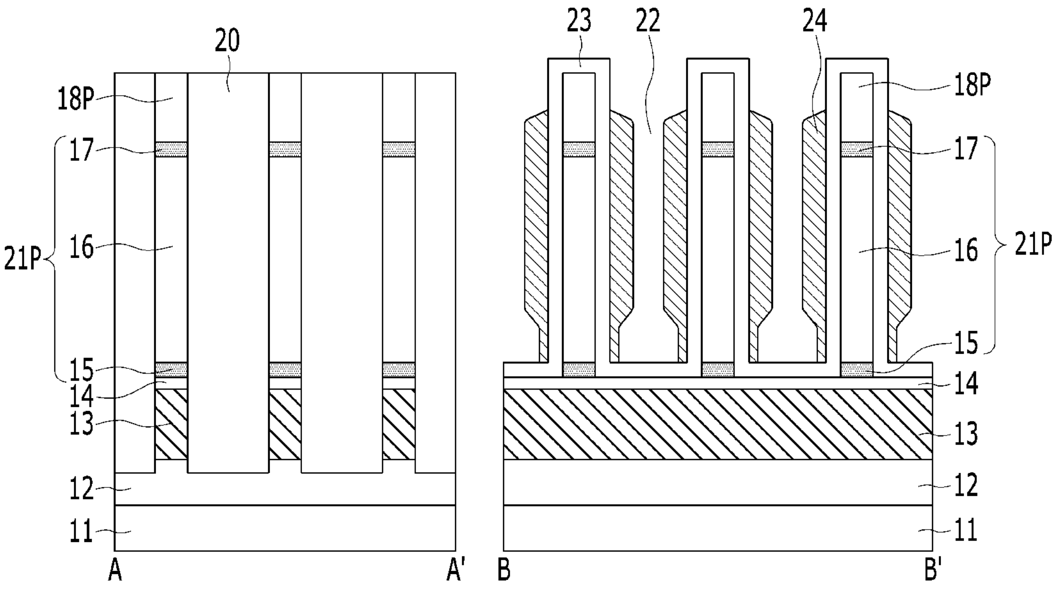

Referring to FIG. 2G, the spacers 25 may be removed. Each of the tapered vertical word lines 24 may have a double structure and the tapered vertical word lines 24 may be respectively formed on the first and second sidewalls of the oxide semiconductor pillars 21P. Referring to FIGS. 1A, 1B, and 1D, the tapered vertical word lines 24 may extend in the second direction D2, and the bit lines 13 may extend in the first direction D1. The oxide semiconductor pillars 21P and the dielectric pillars 20 may be alternately disposed in the second direction D2, and the tapered vertical word lines 24 may extend along the exposed sidewalls of the oxide semiconductor pillars 21P and the dielectric pillar 20.

Figure 2H:
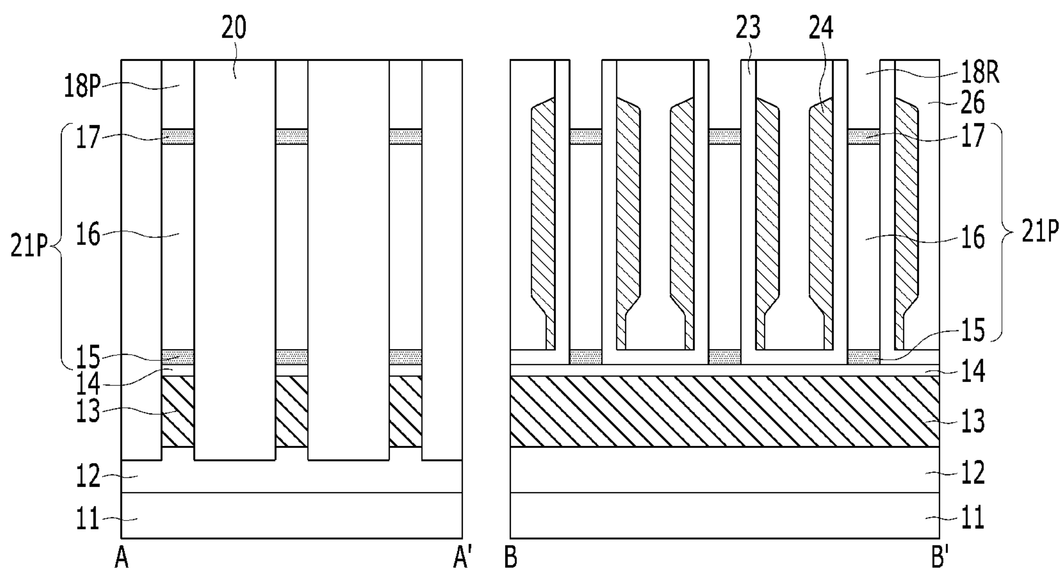

Referring to FIG. 2H, an inter-layer dielectric layer 26 may be formed over the tapered vertical word line 24. The inter-layer dielectric layer 26 may be planarized to expose the upper surfaces of the sacrificial pillars 18P. The inter-layer dielectric layer 26 may include silicon oxide, such as a spin-on dielectric layer (SOD). The sacrificial pillars 18P may serve as an etch stop layer during a planarization process of the inter-layer dielectric layer 26.

Subsequently, the sacrificial pillars 18P may be selectively removed. Accordingly, hole-shaped recessed portions 18R may be formed. The hole-shaped recesses 18R may selectively expose the surfaces of the upper interface layers 17. The sacrificial pillars 18P may be removed by using a wet etching process.

Figure 2I:
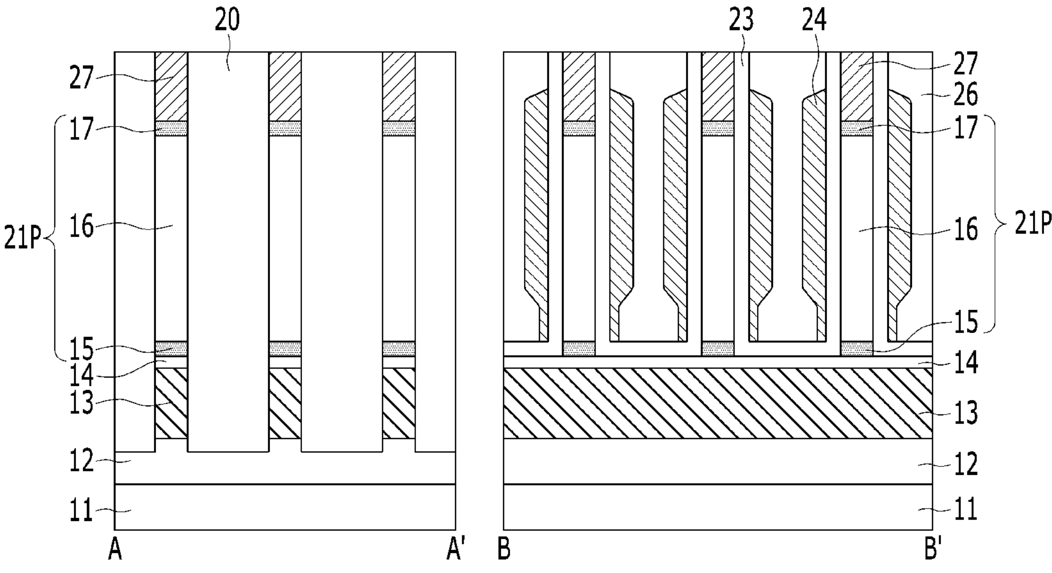

Referring to FIG. 2I, first contact plugs 27 filling the hole-shaped recesses 18R may be formed. The first contact plugs 27 may directly contact the upper interface layers 17. The first contact plugs 27 may include a metal, a metal nitride, or a combination thereof. For example, in order to form the first contact plugs 27, titanium nitride may be deposited to fill the hole-shaped recesses 18R and then titanium nitride may be planarized to expose the surface of the inter-layer dielectric layer 26.

Figure 2J:
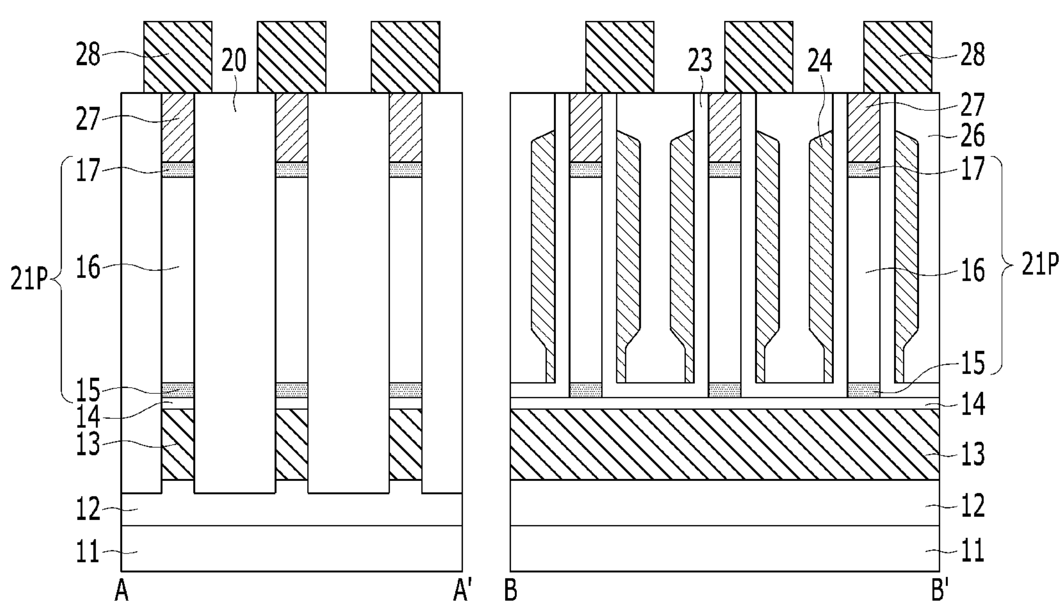

Referring to FIG. 2J, second contact plugs 28 may be formed over the first contact plugs 27. The first contact plugs 27 and the second contact plugs 28 may partially overlap with each other. The second contact plugs 28 may include a metal-based material. The second contact plugs 28 may include a metal, a metal nitride, or a combination thereof. For example, the second contact plugs 28 may include tungsten. According to another embodiment of the present invention, the first contact plugs 27 and the second contact plugs 28 may be formed of the same metal-based material.

A metal-based material may be deposited and etched to form the second contact plugs 28.

Figure 2K:
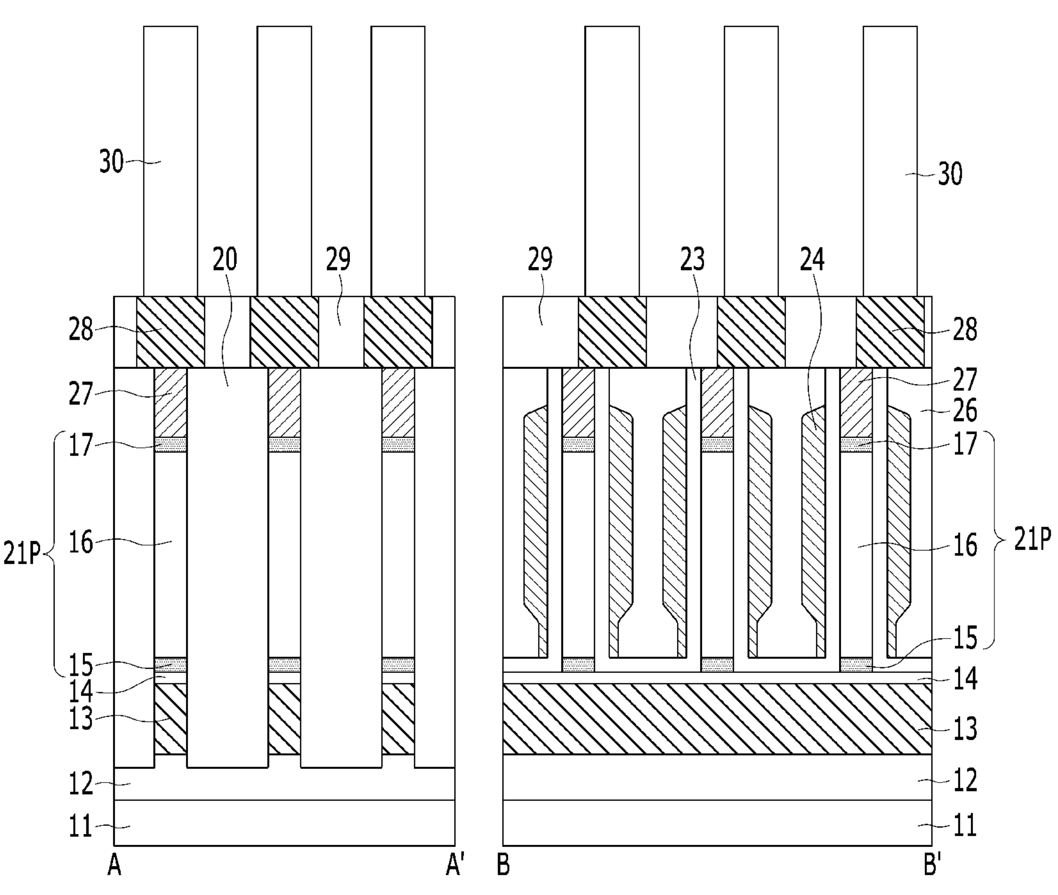

Referring to FIG. 2K, a spacer material layer 29 may be formed over the second contact plugs 28. The spacer material layer 29 may include silicon nitride. The spacer material layer 29 may be formed between the neighboring second contact plugs 28.

A capacitor 30 may be formed over the second contact plug 28.

FIGS. 3A to 3E are cross-sectional views illustrating an example of a method for forming the capacitor 30. Hereinafter, the structures formed before the formation of the second contact plugs 28 are omitted.

Figure 3A:
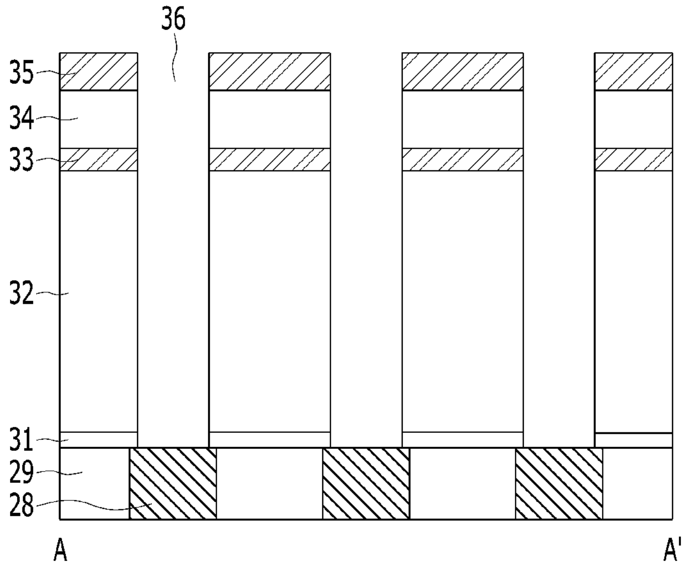
FIGS. 3A to 3E are cross-sectional views illustrating an example of a method for forming a capacitor.

Referring to FIG. 3A, an etch stop layer 31 may be formed over the second contact plugs 28 and the spacer material layer 29. A first mold layer 32, a first supporter layer 33, a second mold layer 34, and a second supporter layer 35 may be sequentially formed over the etch stop layer 31.

The etch stop layer 31 may be formed of a material having an etch selectivity with respect to the first mold layer 32. The etch stop layer 31 may include silicon nitride or silicon oxynitride. The first mold layer 32 may include a dielectric material. The first mold layer 32 may be formed of silicon oxide ($SiO_2$). The first mold layer 32 may be formed to be thicker than the first supporter layer 33. The first mold layer 32 may be formed by using a deposition process, such as chemical vapor deposition (CVD), atomic layer deposition (ALD), or physical vapor deposition (PVD). The first mold layer 32 may include silicon oxide doped with phosphorus or silicon oxide doped with boron. The first mold layer 32 may include USG (Undoped Silicate Glass), PSG (Phosphorous Silicate Glass), BSG (Boron Silicate Glass), BPSG (Boron Phosphorous Silicate Glass), FSG (Fluorine Silicate Glass), or a combination thereof. Phosphorus-doped silicon oxide and boron-doped silicon oxide may be readily removed during the subsequent process because the etching rate with respect to an etching solution is high.

The first supporter layer 33 may be formed of a material having an etch selectivity with respect to the first mold layer 32 and the second mold layer 34. The first supporter layer 33 may include silicon nitride or silicon carbon nitride (SiCN).

The second mold layer 34 may include a dielectric material. The second mold layer 34 may be formed of silicon oxide ($SiO_2$). The second mold layer 34 may be formed to be thicker than the first supporter layer 33. The second mold layer 34 may be formed by a deposition process, such as chemical vapor deposition (CVD), atomic layer deposition (ALD), or physical vapor deposition (PVD). The second mold layer 34 may include phosphorus-doped silicon oxide or boron-doped silicon oxide. The second mold layer 34 may include USG, PSG, BSG, BPSG, FSG, or a combination thereof. The first mold layer 32 and the second mold layer 34 may be formed of the same material or different materials.

According to another embodiment of the present invention, the first mold layer 32 and the second mold layer 34 may be formed of a silicon material, such as amorphous silicon or polysilicon.

The second supporter layer 35 may be formed of a material having an etch selectivity with respect to the second mold layer 34. The second supporter layer 35 may include silicon nitride or silicon carbon nitride (SiCN).

The first supporter layer 33 and the second supporter layer 35 may be formed of the same material or different materials. Both of the first supporter layer 33 and the second supporter layer 35 may be formed of silicon nitride. According to another embodiment of the present invention, the first supporter layer 33 may be formed of silicon nitride, and the second supporter layer 35 may be formed of silicon carbon nitride. The second supporter layer 35 may be thicker than the first supporter layer 33.

According to another embodiment of the present invention, another supporter layer may be further formed. For example, the supporter structure may be a multi-level supporter layer structure.

Subsequently, an opening 36 may be formed. To form the opening 36, the second supporter layer 35, the second mold layer 34, the first supporter layer 33, and the first mold layer 32 may be sequentially etched by using a mask layer (not shown) as an etch barrier. An etching process for forming the opening 36 may stop at 0 the etch stop layer 31. To form the opening 36, a dry etching process, a wet etching process, or a combination thereof may be used. The opening 36 may be referred to as a hole in which a lower electrode (or a storage node) is to be formed.

Subsequently, the etch stop layer 31 may be etched in order to expose the upper surface of the second contact plug 38 below the opening 36.

Figure 3B:
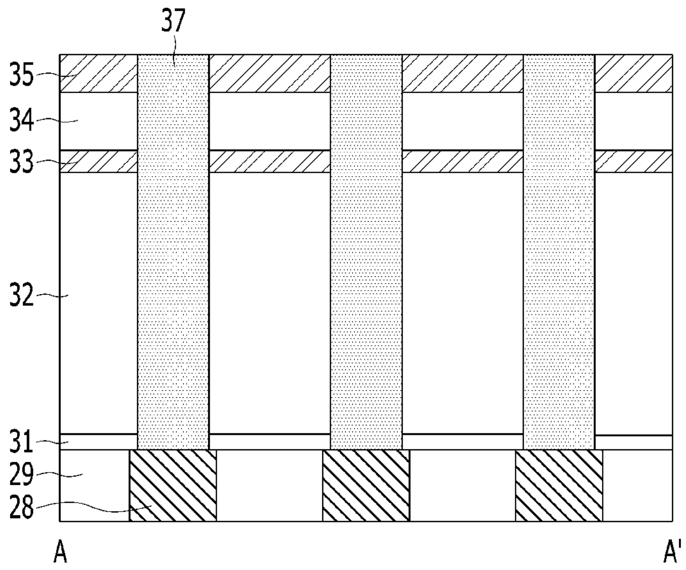

Referring to FIG. 3B, a lower electrode 37 may be formed in the opening 36. The lower electrode 37 may fill the inside of the opening 36. The lower electrode 37 may include polysilicon, a metal, a metal nitride, a conductive metal oxide, a metal silicide, a noble metal, or a combination thereof. The lower electrode 37 may include at least one among titanium (Ti), titanium nitride (TiN), tantalum (Ta), tantalum nitride (TaN), titanium aluminum nitride (TiAlN), tungsten (W), tungsten nitride (WN), ruthenium (Ru), ruthenium oxide ($RuO_2$), iridium (Ir), iridium oxide ($IrO_2$), platinum (Pt), and a combination thereof. The lower electrode 37 may include titanium nitride (TiN). The lower electrode 37 may include titanium nitride (ALD-TIN) which is formed by atomic layer deposition (ALD). According to another embodiment of the present invention, the lower electrode 37 may include a hybrid structure of a titanium nitride cylinder and a polysilicon pillar.

Figure 3C:
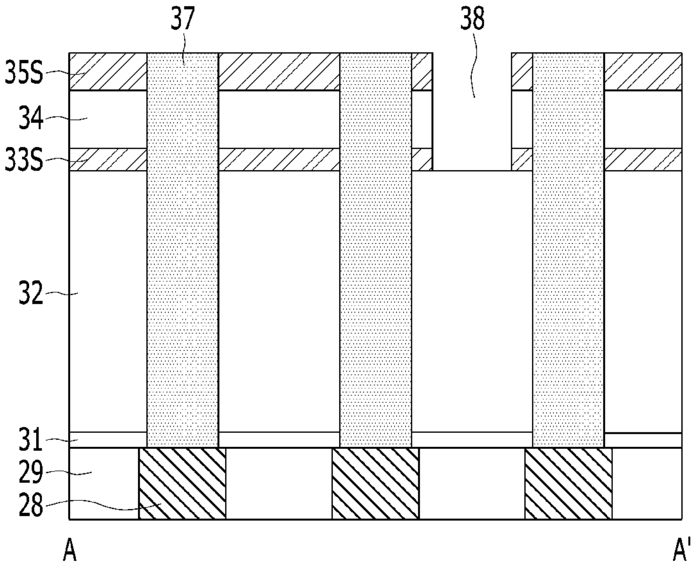

Referring to FIG. 3C, the second supporter layer 35, the second mold layer 34, and the first supporter layer 33 may be sequentially etched. As a result, a supporter opening 38 exposing the first mold layer 32 may be formed, and an upper-level supporter 35S and a lower-level supporter 33S may be formed.

The upper level supporter 35S and the lower level supporter 33S may contact the outer wall of the lower electrode 37. The upper-level supporter 35S and the lower-level supporter 33S may prevent the lower electrodes 37 from collapsing in the subsequent process of removing the second mold layer 34 and the first mold layer 32.

Figure 3D:
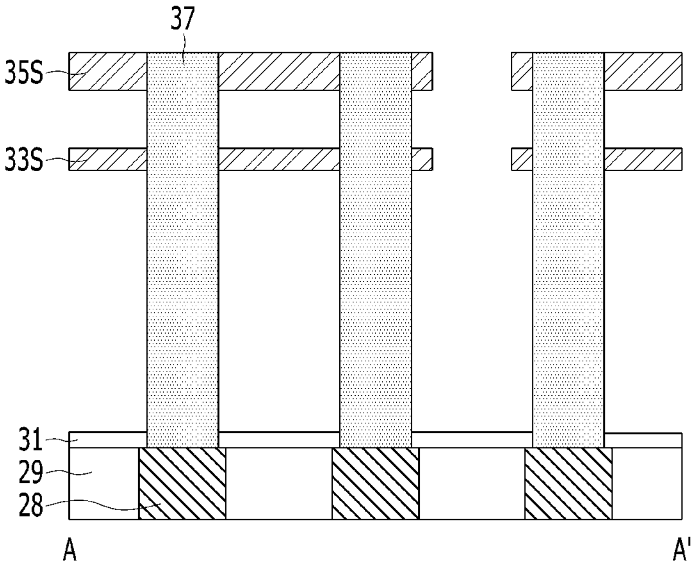

Referring to FIG. 3D, the second mold layer 34 and the first mold layer 32 may be removed through the supporter opening 38. The first and second mold layers 32 and 34 may be removed by a wet dip-out process. The wet dip-out process for removing the first and second mold layers 32 and 34 may be performed by using an etching solution capable of selectively removing the first and second mold layers 32 and 34. When the first and second mold layers 32 and 34 include silicon oxide, the first and second mold layers 32 and 34 may be removed by a wet etching process using hydrofluoric acid (HF).

Figure 3E:
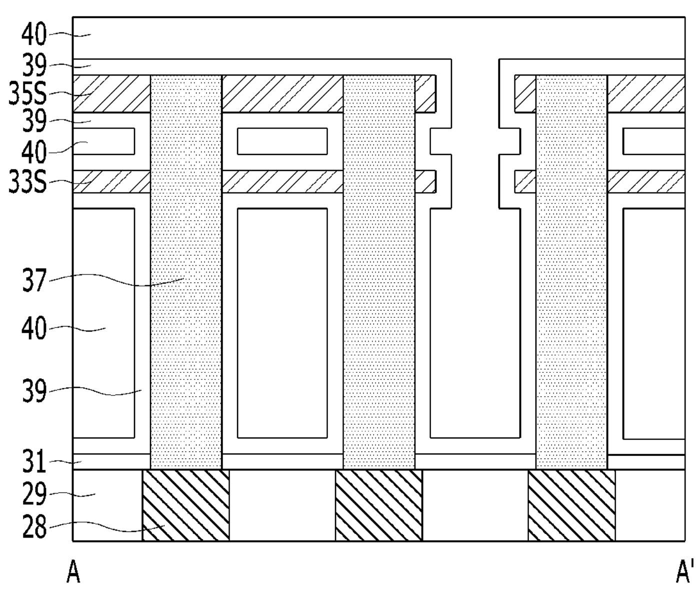

Referring to FIG. 3E, a dielectric layer 39 may be formed over the lower electrode 37 and the lower and upper level supporters 33S and 35S. The dielectric layer 39 may include a high-k material having a higher dielectric constant than silicon oxide. The high-k material may include hafnium oxide ($HfO_2$), zirconium oxide ($ZrO_2$), aluminum oxide ($Al_2O_3$), titanium oxide ($TiO_2$), tantalum oxide ($Ta_2O_5$), niobium oxide ($Nb_2O_5$) or strontium titanium oxide ($SrTiO_3$). According to another embodiment of the present invention, the dielectric layer 39 may be formed of a composite layer including two or more layers of the above-mentioned high-k materials. According to the embodiment of the present invention, the dielectric layer 39 may be formed of a zirconium oxide-based material having excellent leakage current characteristics while sufficiently lowering the equivalent oxide thickness (EOT). For example, it may include a ZAZ ($ZrO_2/Al_2O_3/ZrO_2$) stack. According to another embodiment of the present the dielectric layer 27 may include a $TiO_2/ZrO_2/Al_2O_3/ZrO_2$ stack, a $TiO_2/HfO_2/Al_2O_3/HfO_2$ stack, a $Ta_2O_5/ZrO_2/Al_2O_3/ZrO_2$ stack, or a $Ta_2O_5/HfO_2/Al_2O_3/HfO_2$ stack.

Subsequently, an upper electrode 40 may be formed over the dielectric layer 39. The upper electrode 40 may fill the space between the neighboring lower electrodes 37. The upper electrode may extend to cover the upper portions of the lower electrodes 37. The upper electrode 40 may include a conductive material. The upper electrode 40 may be stacked (reference numerals omitted) in the order of a liner electrode, a gap-fill electrode, and a low-resistance electrode. The liner electrode of the upper electrode 40 may include titanium nitride, and the gap-fill electrode of the upper electrode 40 may include silicon germanium. The low resistance electrode of the upper electrode 40 may include tungsten or tungsten nitride.

Figure 4A:
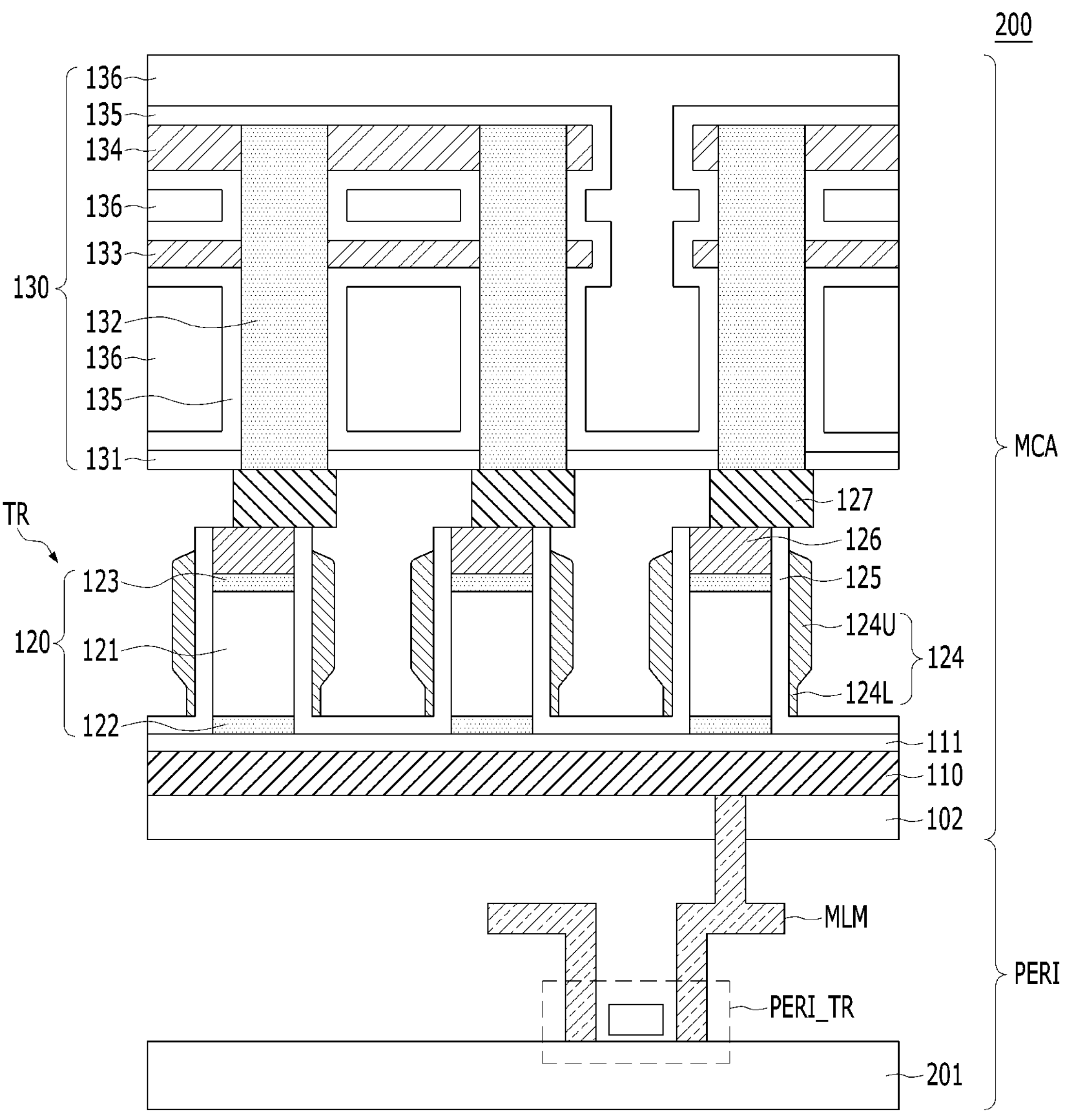
FIG. 4A is a cross-sectional view illustrating a semiconductor device in accordance with another embodiment of the present invention.

FIG. 4A is a cross-sectional view illustrating a semiconductor device in accordance with another embodiment of the present invention. The semiconductor device 200 of FIG. 4A may be similar to the semiconductor device 100 shown in FIGS. 1A to 1E. Hereinafter, as for the detailed descriptions on the constituent elements which also appear in FIGS. 1A to 1E, the description of FIGS. 1A to 1E may be referred to.

Referring to FIG. 4A, the semiconductor device 200 may include a peripheral circuit portion PERI including a substrate 201, and a memory cell array MCA over the peripheral circuit portion PERI. The memory cell array MCA may include a bit line 110, a transistor TR, and a capacitor 130. The transistor TR may include a vertical channel transistor. The memory cell array MCA may include a plurality of memory cells sharing the bit line 110.

The transistor TR may include an oxide semiconductor pillar 120 which is disposed between the bit line 110 and the capacitor 130, a tapered vertical word line 124 which is disposed over a sidewall of the oxide semiconductor pillar 120, and a gate dielectric layer 125 disposed between the oxide semiconductor pillar 120 and the tapered vertical word line 124. The oxide semiconductor pillar 120 may include a lower interface layer 122, an oxide semiconductor channel layer 121, and an upper interface layer 123. The lower interface layer 122, the oxide semiconductor channel layer 121, and the upper interface layer 123 may all include an oxide semiconductor material. The lower interface layer 122, the oxide semiconductor channel layer 121, and the upper interface layer 123 may all include IGZO, but the lower interface layer 122 and the upper interface layer 123 may have a greater indium concentration than the oxide semiconductor channel layer 121. The oxide semiconductor channel layer 121 may be IGZO, and the lower interface layer 122 and the upper interface layer 123 may be indium-rich IGZO.

The tapered vertical word line 124 may include a lower level portion 124L and an upper level portion 124U.

The bit line 110 and a peripheral transistor PERI_TR of the peripheral circuit portion PERI may be coupled to each other through a metal interconnection MLM. The uppermost layer of the metal interconnection MLM may pass through a buffer layer 102 to be coupled to the bit line 110.

The semiconductor device 200 may include a peripheral-under-cell (PUC) structure in which the memory cell array MCA is formed over the peripheral circuit portion PERI.

Figure 4B:
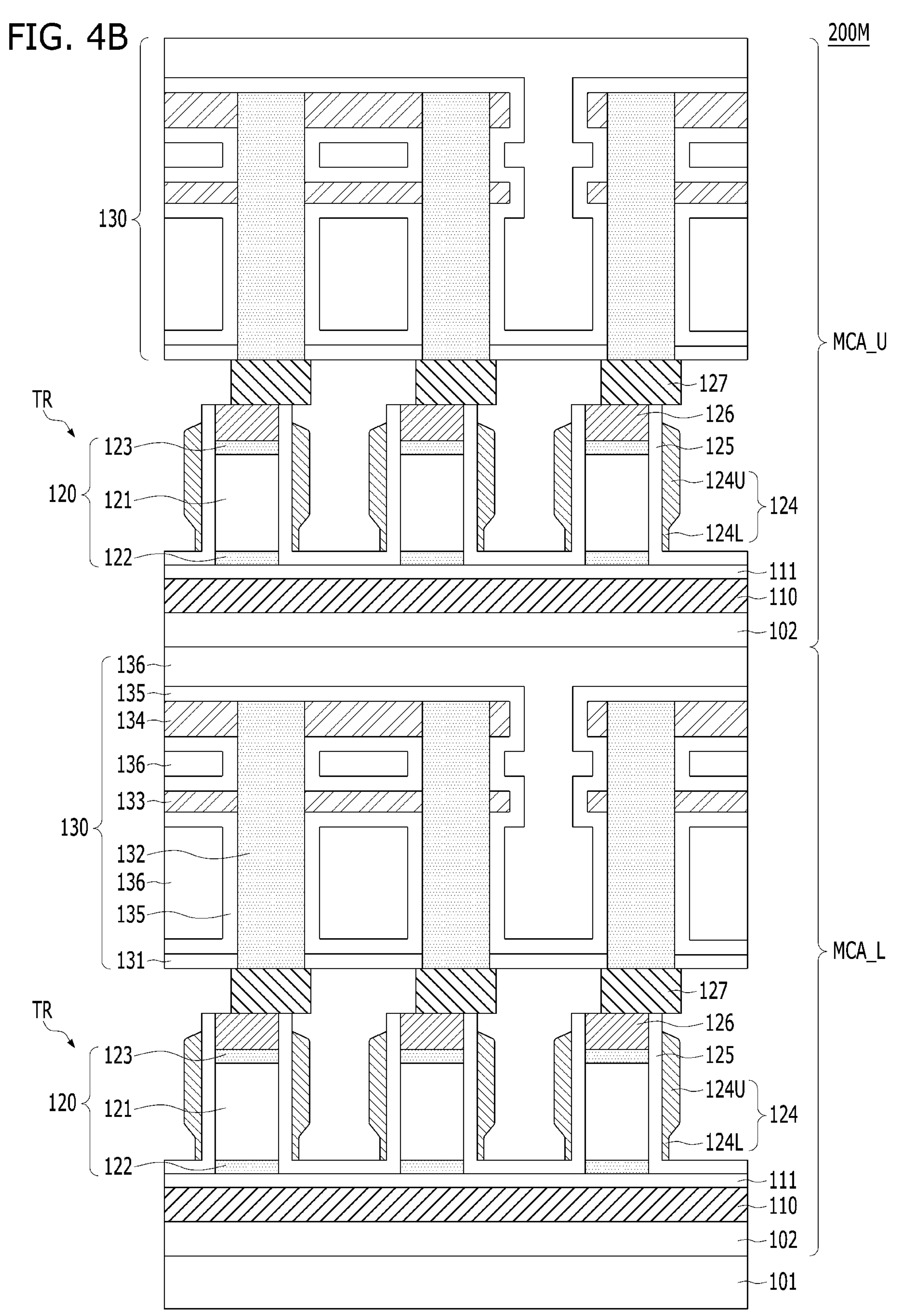
FIG. 4B is a cross-sectional view illustrating a semiconductor device in accordance with another embodiment of the present invention.

FIG. 4B is a cross-sectional view illustrating a semiconductor device 200M in accordance with another embodiment of the present invention. The semiconductor device 200M of FIG. 4B may be similar to the semiconductor device 100 shown in FIGS. 1A to 1E. Hereinafter, as for the detailed descriptions on the constituent elements also appearing in FIGS. 1A to 1E, descriptions of FIGS. 1A to 1E may be referred to.

Referring to FIG. 4B, the semiconductor device 200M may be an array of memory cells including a bit line 110, an oxide semiconductor pillar 120, and a capacitor 130. For example, the lower level memory cell array MCA_L and the upper level memory cell array MCA_U may be vertically stacked. Each of the memory cells of the lower level memory cell array MCA_L and the upper level memory cell array MCA_U may include a bit line 110, a transistor TR, and a capacitor 130. The transistor TR may include a vertical channel transistor. The transistor TR may include an oxide semiconductor pillar 120 which is disposed between the bit line 110 and the capacitor 130, a tapered vertical word line 124 which is disposed over a sidewall of the oxide semiconductor pillar 120, and a gate dielectric layer 125 disposed between the oxide semiconductor pillar 120 and the tapered vertical word line 124. The oxide semiconductor pillar 120 may include a lower interface layer 122, an oxide semiconductor channel layer 121, and an upper interface layer 123. The lower interface layer 122, the oxide semiconductor channel layer 121, and the upper interface layer 123 may all include an oxide semiconductor material. The lower interface layer 122, the oxide semiconductor channel layer 121, and the upper interface layer 123 may all include IGZO, but the lower interface layer 122 and the upper interface layer 123 may have a higher indium concentration than the oxide semiconductor channel layer 121. The oxide semiconductor channel layer 121 may be IGZO, and the lower interface layer 122 and the upper interface layer 123 may be indium-rich IGZO. The tapered vertical word line 124 may include a lower level portion 124L and an upper level portion 124U.

The upper electrode 136 of the lower level memory cell array MCA_L may directly contact the buffer layer 102 of the upper level memory cell array MCA_U.

The lower level memory cell array MCA_L and the upper level memory cell array MCA_U may be stacked without wafer bonding.

Figure 5:
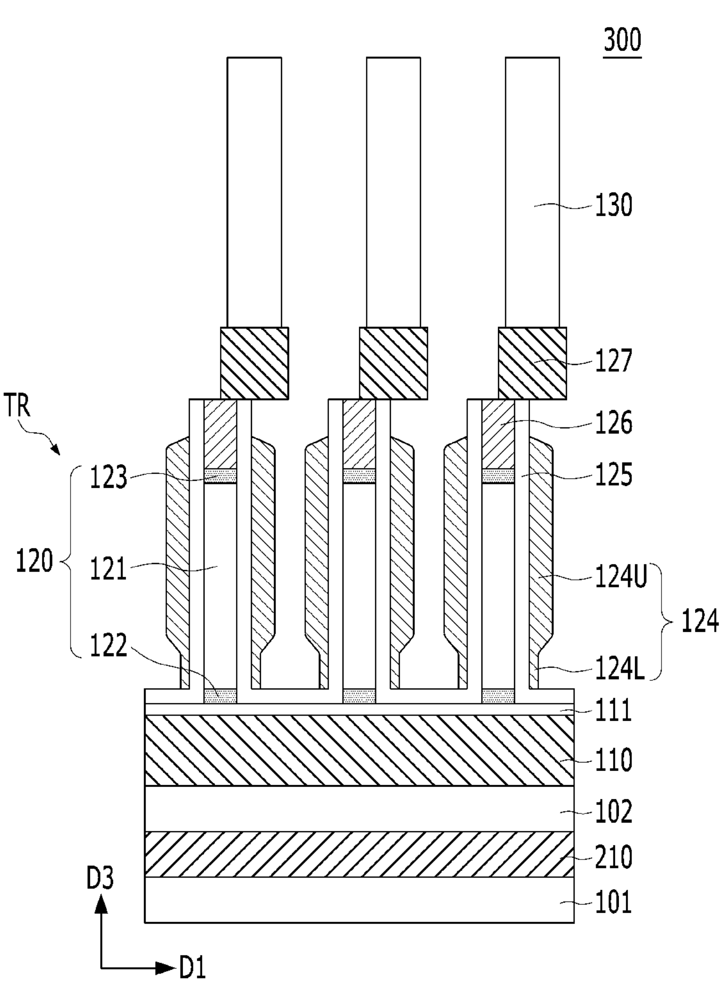
FIG. 5 is a cross-sectional view illustrating a semiconductor device in accordance with another embodiment of the present invention.

FIG. 5 is a cross-sectional view illustrating a semiconductor device in accordance with another embodiment of the present invention. The semiconductor device 300 of FIG. 5 may be similar to the semiconductor device 100 of FIGS. 1A to 1E. Hereinafter, as for the detailed descriptions on the constituent elements also appearing in FIGS. 1A to 1E, descriptions of FIGS. 1A to 1E may be referred to.

Referring to FIG. 5, the semiconductor device 300 may include a bit line 110, a vertical channel transistor TR, and a capacitor 130 that are disposed vertically in the third direction D3. The vertical channel transistor TR may include an oxide semiconductor pillar 120 disposed between the bit line 110 and the capacitor 130, a tapered vertical word line 124 disposed over a sidewall of the oxide semiconductor pillar 120, and a gate dielectric layer 125 disposed between the oxide semiconductor pillar 120 and the tapered vertical word line 124. The oxide semiconductor pillar 120 may include a lower interface layer 122, an oxide semiconductor channel layer 121, and an upper interface layer 123. The lower interface layer 122, the oxide semiconductor channel layer 121, and the upper interface layer 123 may all include an oxide semiconductor material. The lower interface layer 122, the oxide semiconductor channel layer 121, and the upper interface layer 123 may all include IGZO, but the lower interface layer 122 and the upper interface layer 123 may have a higher indium concentration than the oxide semiconductor channel layer 121. The oxide semiconductor channel layer 121 may be IGZO, and the lower interface layer 122 and the upper interface layer 123 may be indium-rich IGZO.

The semiconductor device 300 may further include a dummy plate 210 below the bit line 110. The dummy plate 210 may include a metal-based material. The buffer layer 102 may be disposed between the dummy plate 210 and the bit line 110. Although parasitic capacitance may be increased due to the dummy plate 210, coupling noise may be improved because the coupling capacitance ratio between the bit lines 110 is decreased. Referring to FIGS. 1B and 5, the coupling capacitance ratio between the bit lines 110 that are spaced apart from each other in the second direction D2 may decrease by the dummy plate 210. The optimal ratio of the parasitic capacitance may be controlled by adjusting the thickness of the buffer layer 102 between the dummy plate 210 and the bit line 110.

Figure 6A:
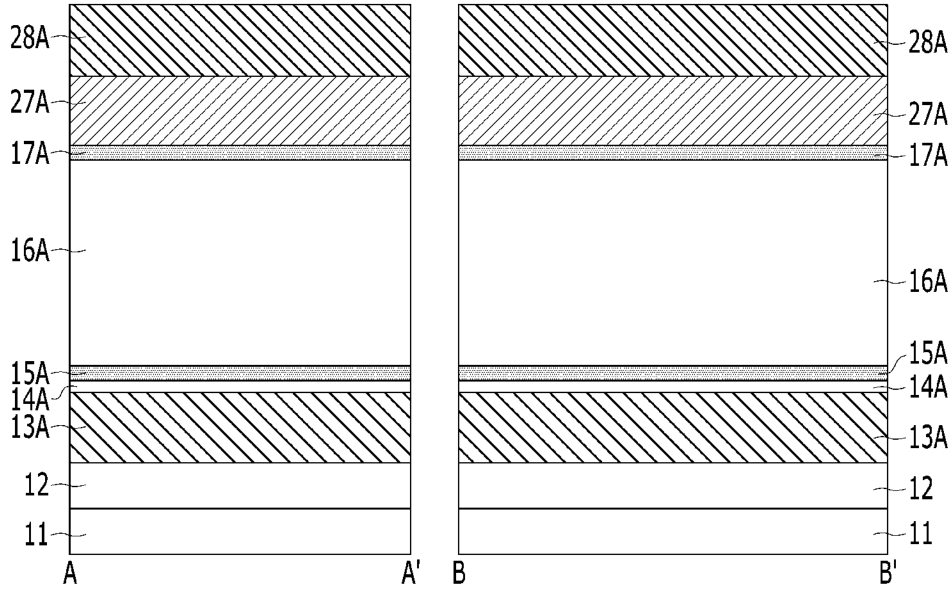
FIGS. 6A to 6C are cross-sectional views illustrating a method for fabricating a semiconductor device in accordance with another embodiment of the present invention.
Figure 6B:
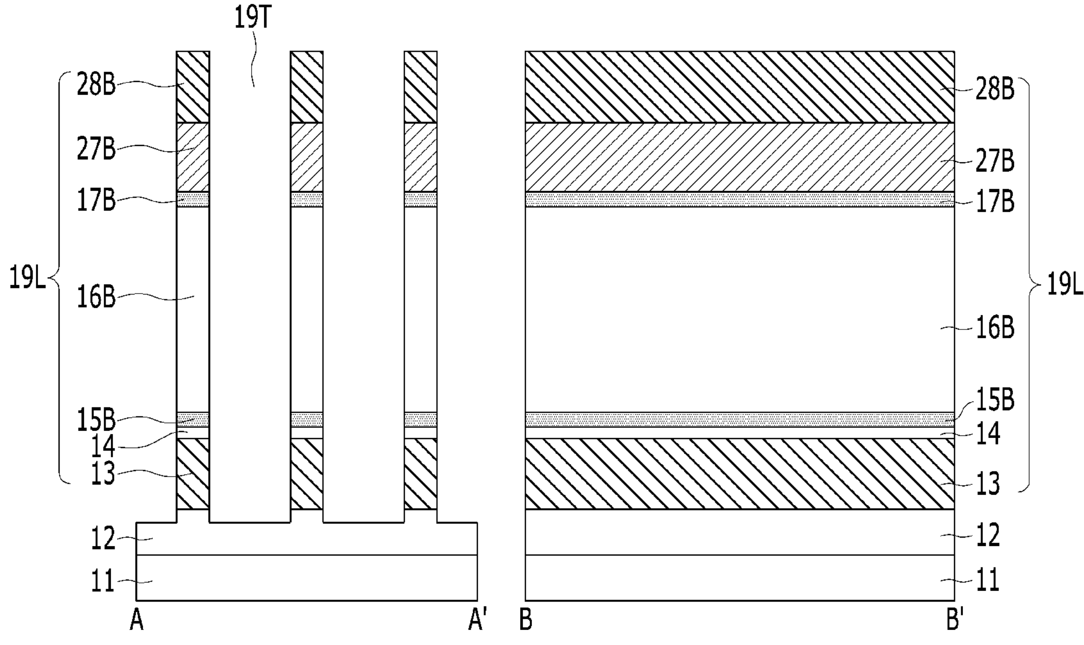
Figure 6C:
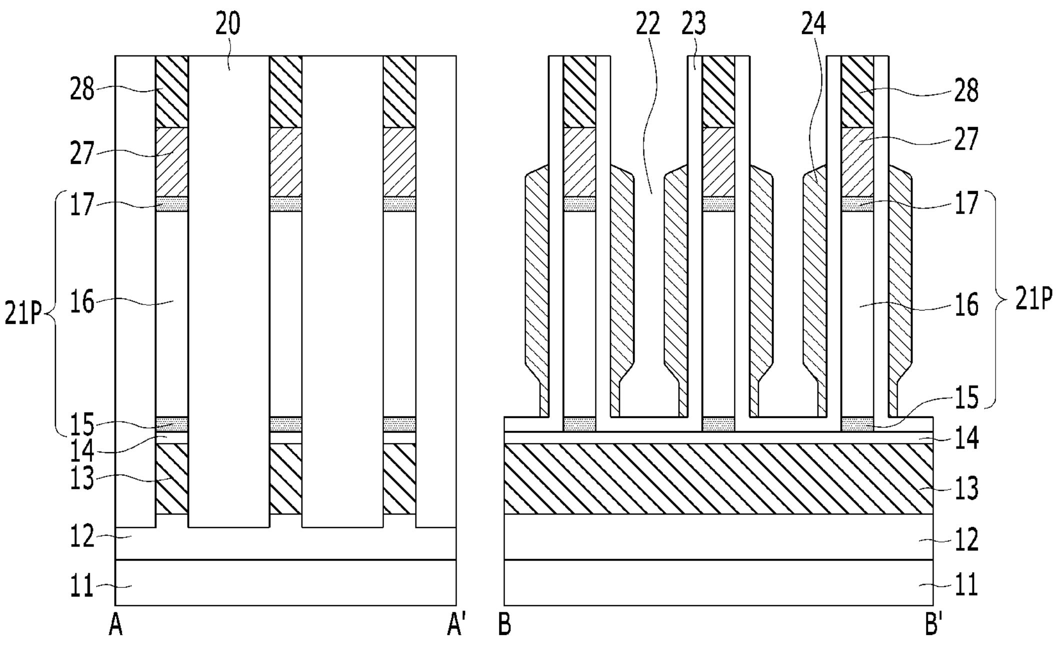

FIGS. 6A to 6C are cross-sectional views illustrating a method for fabricating a semiconductor device in accordance with another embodiment of the present invention. The method of fabricating the semiconductor device of FIGS. 6A to 6C may be similar to that of FIGS. 2A to 2K. Hereinafter, as for the detailed descriptions on the constituent elements also appearing in FIGS. 2A to 2K, descriptions of FIGS. 2A to 2K may be referred to.

Referring to FIG. 6A, a buffer layer 12 may be formed over the substrate 11. A conductive layer 13A, a barrier material layer 14A, a lower interface material layer 15A, a channel material layer 16A, and an upper interface material layer 17A may be sequentially formed over the buffer layer 12.

Subsequently, a first contact layer 27A and a second contact layer 28A may be stacked over the upper interface material layer 17A. The first contact layer 27A may include titanium nitride, and the second contact layer 28A may include tungsten.

Referring to FIG. 6B, line structures 19L may be formed. Each of the line structures 19L may include a stack of a bit line 13, a bit line barrier layer 14, a lower interface layer 15B, a channel material layer 16B, an upper interface layer 17B, a first contact layer 27B, and the second contact layer 28B. First trenches 19T may be formed between the line structures 19L.

Referring to FIG. 6C, a portion of the line structures 19L may be selectively etched. As a result, oxide semiconductor pillars 21P may be formed over the bit line barrier layer 14. Each of the oxide semiconductor pillars 21P may include a stack of a lower interface layer 15, a channel layer 16, and an upper interface layer 17. The lower interface layer 15, the channel layer 16, and the upper interface layer 17 may be formed by etching the lower interface layer 15B, the channel material layer 16B, and the upper interface layer 17B, respectively. A stack of first contact plugs 27 and second contact plugs 28 may be formed over the upper interface layers 17. The first contact plugs 27 may be formed by etching the first contact layer 27B, and the second contact plugs 28 may be formed by etching the second contact layer 28B.

Trenches 22 may be formed between the oxide semiconductor pillars 21P. The first contact plugs 27 and the second contact plugs 28 may be cut by the trenches 22, and accordingly, each of the first contact plugs 27 and the second contact plugs 28 may have a pillar shape.

Subsequently, a gate dielectric layer 23 may be formed on the sides of the oxide semiconductor pillars 21P. The gate dielectric layer 23 may cover the sidewalls of the first contact plugs 27 and the second contact plugs 28.

Subsequently, tapered vertical word lines 24 may be formed over the gate dielectric layer 23.

Subsequently, as illustrated in FIG. 2K, a capacitor 30 may be formed over the second contact plugs 28.

FIGS. 7A to 7G are cross-sectional views illustrating a method for fabricating a semiconductor device in accordance with another embodiment of the present invention. The method of fabricating the semiconductor device of FIGS. 7A to 7G may be similar to that of FIGS. 2A to 2K. Hereinafter, as for the detailed descriptions on the constituent elements also appearing in FIGS. 2A to 2K, descriptions of FIGS. 2A to 2K may be referred to.

Figure 7A:
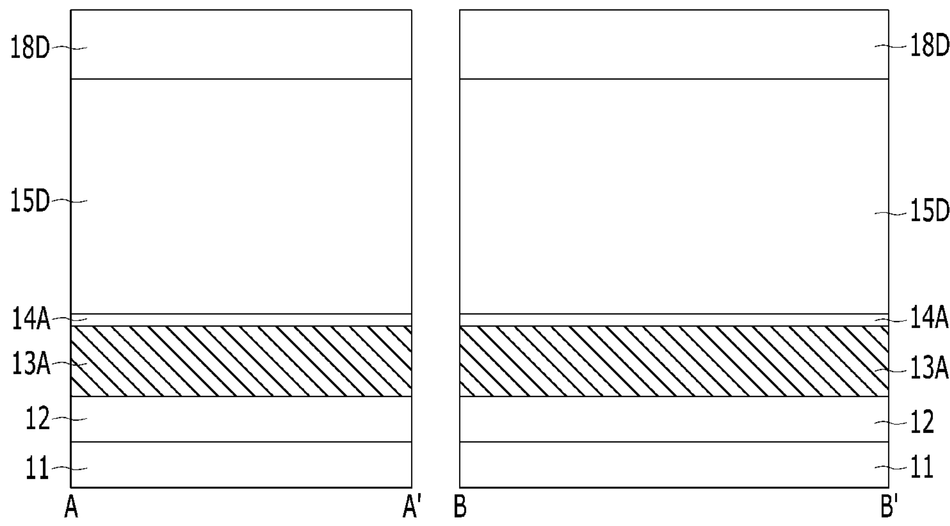
FIGS. 7A to 7G are cross-sectional views illustrating a method for fabricating a semiconductor device in accordance with another embodiment of the present invention.

Referring to FIG. 7A, a buffer layer 12 may be formed over the substrate 11. A conductive layer 13A and a barrier material layer 14A may be formed over the buffer layer 12.

Subsequently, a first sacrificial layer 15D and a second sacrificial layer 18D may be sequentially formed over the barrier material layer 14A. The first sacrificial layer 15D may include polysilicon, and the second sacrificial layer 18D may include silicon nitride.

Figure 7B:
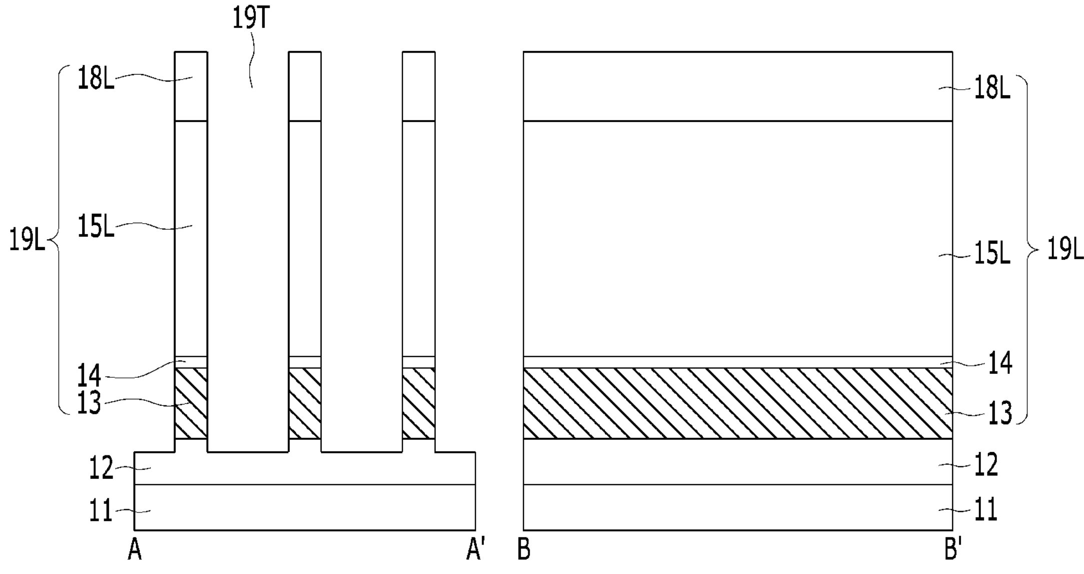

Referring to FIG. 7B, second sacrificial layer lines 18L may be formed. The second sacrificial layer lines 18L may be formed by etching the second sacrificial layer 18D. The second sacrificial layer lines 18L may be formed by a double patterning process.

Subsequently, a first sacrificial layer 15D may be etched by using the second sacrificial layer lines 18L as an etch barrier, and the barrier material layer 14A and the conductive layer 13A may be etched continuously.

A plurality of line structures 19L may be formed over the buffer layer 12 by a series of the etching processes described above. Each of the line structures 19L may include a stack of a bit line 13, a bit line barrier layer 14, a first sacrificial layer line 15L, and a second sacrificial layer line 18L. The bit line barrier layer 14 may be formed by etching the barrier material layer 14A, and the bit line 13 may be formed by etching the conductive layer 13A. The first sacrificial layer line 15L may be formed by etching the first sacrificial layer 15D. First trenches 19T may be formed between the line structures 19L.

Figure 7C:
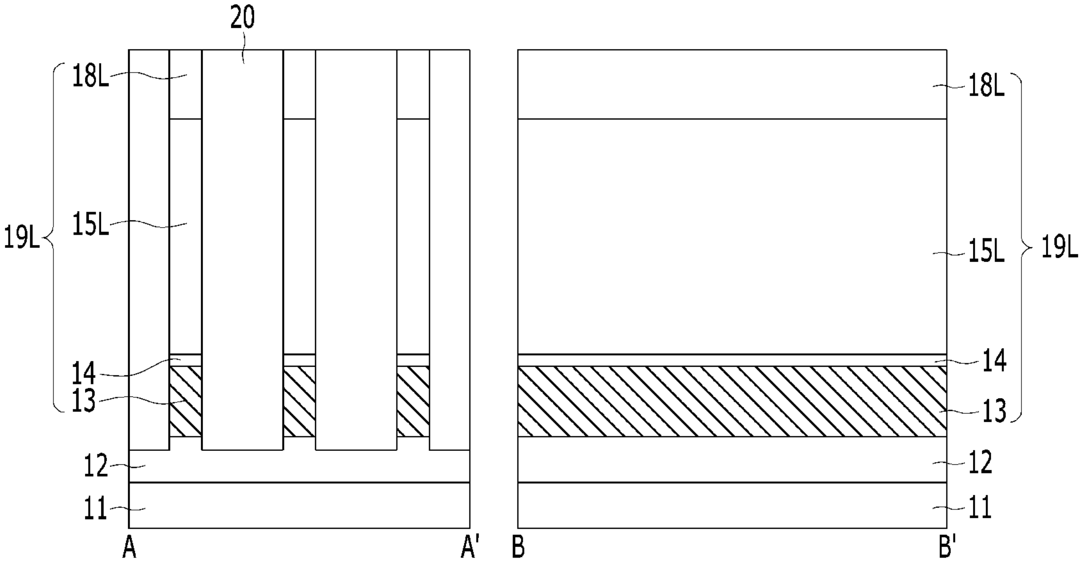

Referring to FIG. 7C, dielectric lines 20 may be formed between the line structures 19L. The dielectric lines 20 may include a dielectric material. For example, the dielectric lines 20 may include silicon oxide, silicon nitride, silicon carbon oxide (SiCO), a spin-on-dielectric layer, or a combination thereof. The dielectric lines 20 may be formed by depositing a dielectric material to fill the first trenches 19T between the line structures 19L and performing a planarization process of a dielectric material. The dielectric lines 20 may be formed by sequentially forming a silicon nitride, a silicon carbon oxide, and a spin-on dielectric layer and performing a planarization process.

Figure 7D:
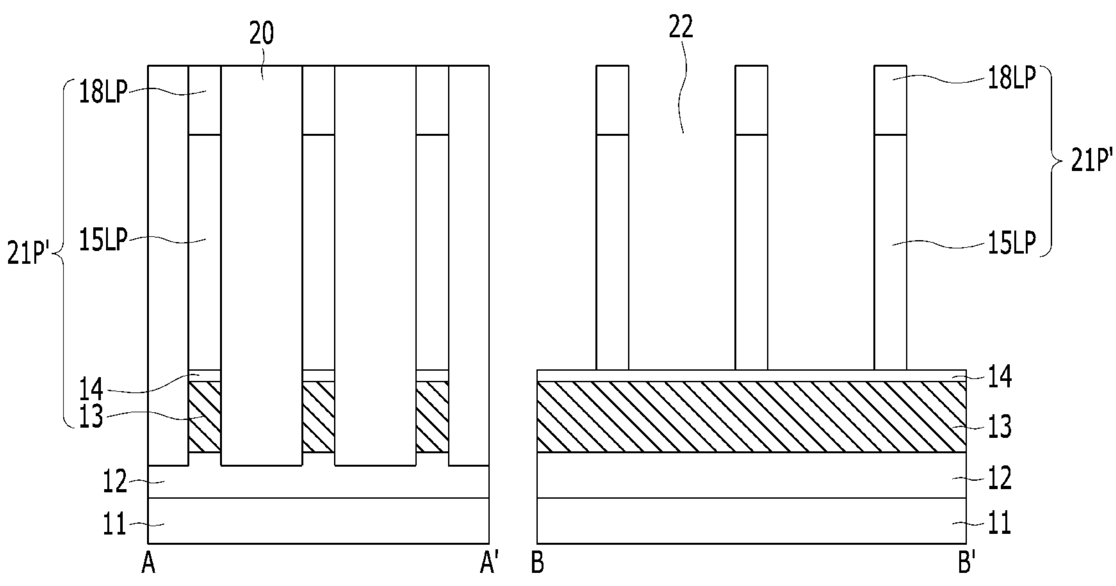
Figure 7E:
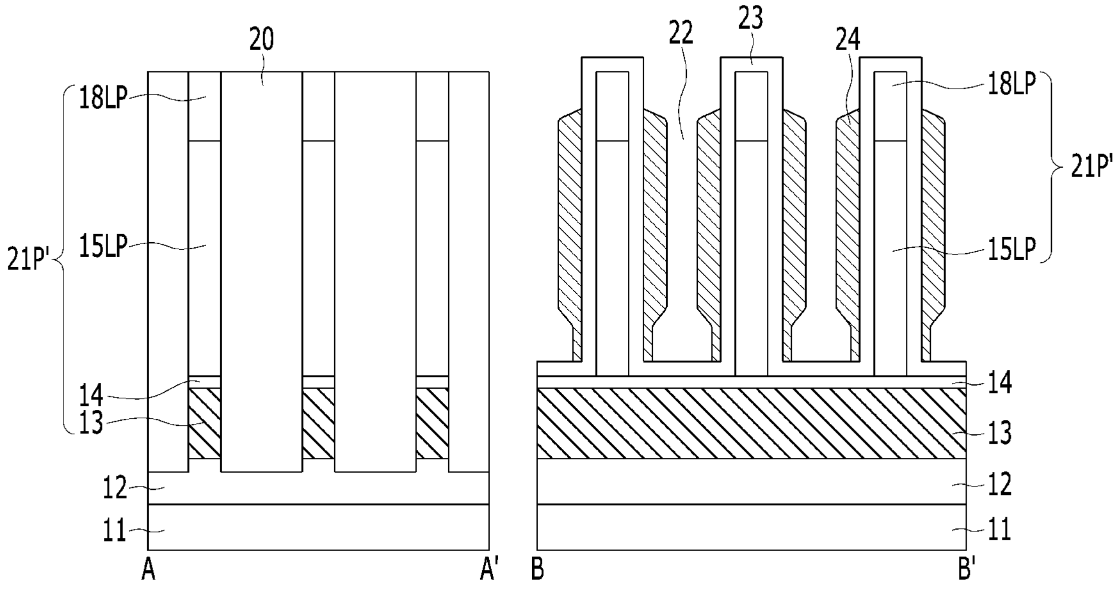

Referring to FIG. 7D, a portion of the line structures 19L may be selectively etched to form sacrificial pillars 21P'. The bit line barrier layer 14 and the bit line 13 may be disposed below the sacrificial pillars 21P'.

Each of the sacrificial pillars 21P' may include a stack of a first sacrificial pillar 15LP and a second sacrificial pillar 18LP. The first sacrificial pillar 15LP may be formed by etching the first sacrificial layer line 15L, and the second sacrificial pillar 18LP may be formed by etching the second sacrificial layer line 18L.

Second trenches 22 may be formed between the sacrificial pillars 21P'.

Subsequently, the gate dielectric layer 23 and the tapered vertical word line 24 may be formed by a series of the processes as illustrated in FIGS. 2E and 2F. In other words, referring to FIG. 7E, the gate dielectric layer 23 may be formed on the sides of the sacrificial pillars 21P'. The tapered vertical word line 24 may be formed over the gate dielectric layer 23. The bottom portion of the tapered vertical word line 24 may have a smaller thickness than the other portions.

Figure 7F:
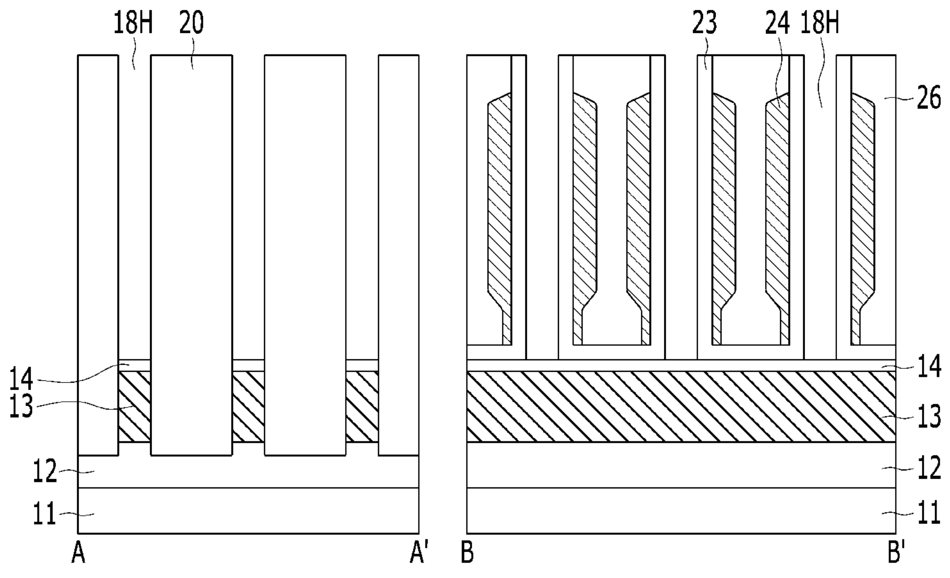

Referring to FIG. 7F, an inter-layer dielectric layer 26 may be formed over the tapered vertical word line 24. The inter-layer dielectric layer 26 may be planarized to expose the upper surfaces of the second sacrificial pillars 18LP.

Subsequently, the second sacrificial pillars 18LP and the first sacrificial pillars 15LP may be selectively removed. Accordingly, pillar-shaped openings 18H may be formed. The bottom surface of the pillar-shaped openings 18H may expose the surface of the barrier layer 14.

Figure 7G:
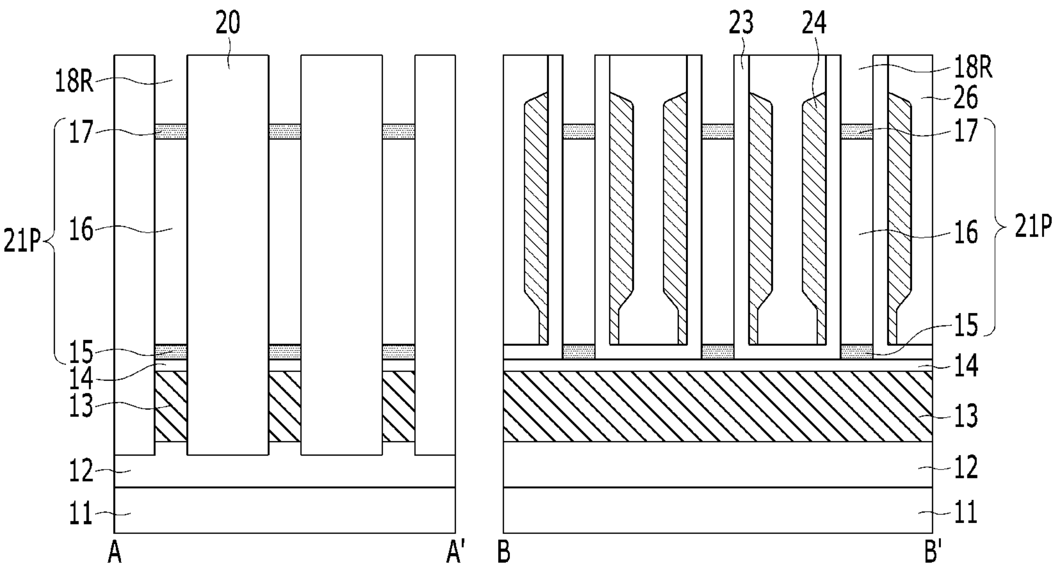

Referring to FIG. 7G, oxide semiconductor pillars 21P filling the pillar-shaped openings 18H may be formed. Each of the oxide semiconductor pillars 21P may include a stack of the lower interface layer 15, the channel layer 16, and the upper interface layer 17. The lower interface layer 15, the channel layer 16, and the upper interface layer 17 may be formed by epitaxial growth, individually.

The lower interface layer 15 may contain indium. The lower interface layer 15 may include an indium-rich oxide semiconductor material. For example, the lower interface layer 15 may include indium-rich IGZO. The lower interface layer 15 may be formed to have a thickness of approximately 10 to 50 Å.

A channel layer 16 may be formed on the lower interface layer 15. The channel layer 16 may contain indium. The channel layer 16 may include IGZO. The channel layer 16 may be formed to have a thickness of 200 to 1000 Å.

An upper interface layer 17 may be formed over the channel layer 16. The upper interface layer 17 may contain indium. The upper interface layer 17 may include an indium-rich oxide semiconductor material. For example, the upper interface layer 17 may include indium-rich IGZO. The upper interface layer 17 may be formed to have a thickness of approximately 10 to 50 Å.

The oxide semiconductor pillars 21P may partially fill the pillar-shaped openings 18H, and thus hole-shaped recesses 18R may be defined by the oxide semiconductor pillars 21P.

Subsequently, a series of the processes as described in FIGS. 21 to 2K may be performed.

Figure 8:
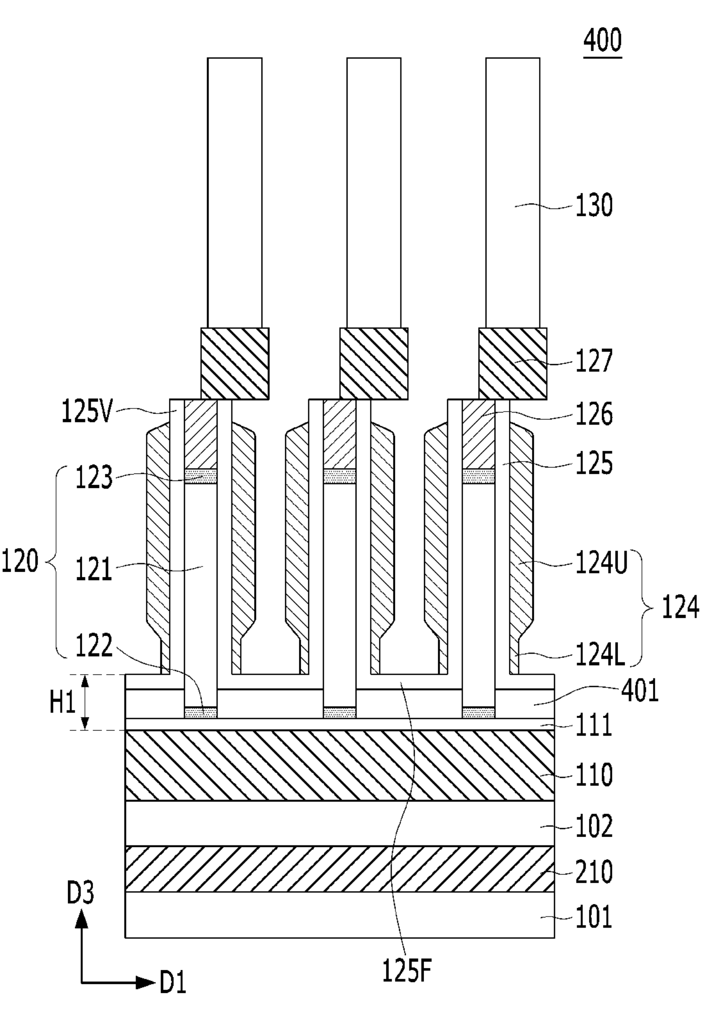
FIGS. 8 to 10 are cross-sectional views illustrating semiconductor devices in accordance with other embodiments of the present invention.
Figure 9:
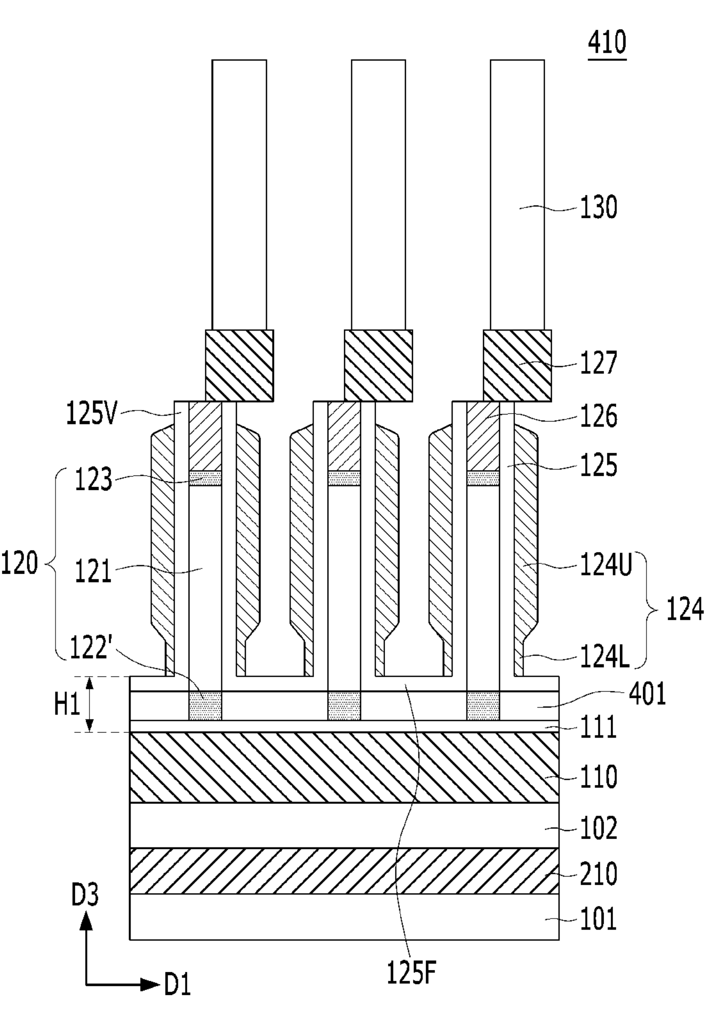
Figure 10:
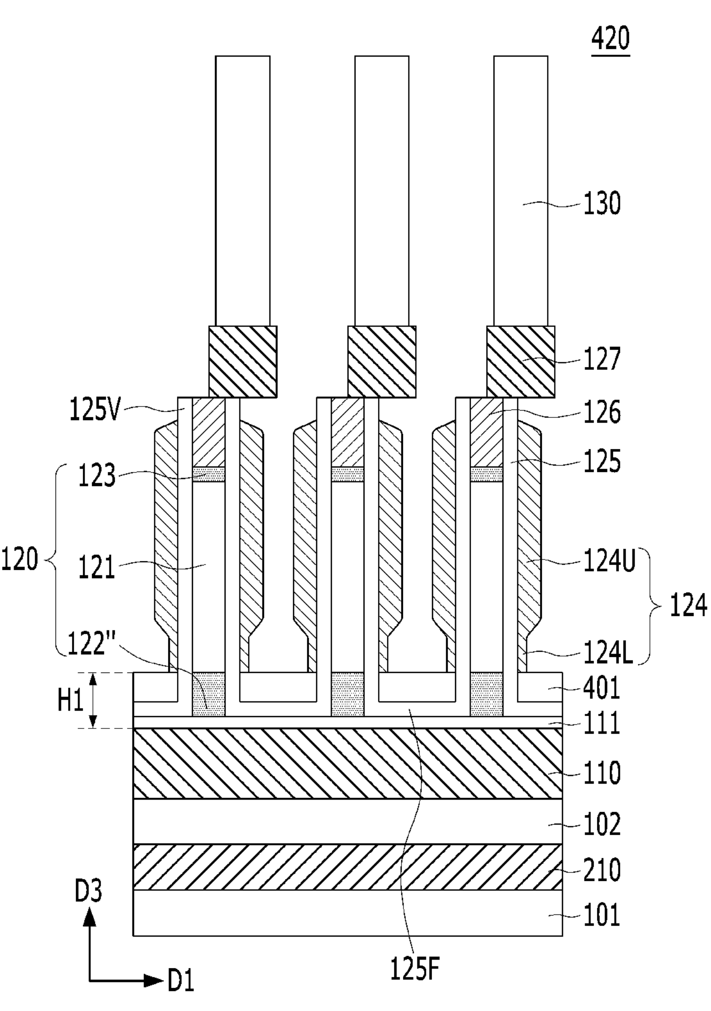

FIGS. 8 to 10 are cross-sectional views illustrating semiconductor devices in accordance with other embodiments of the present invention. FIGS. 8 to 10 may be similar to the semiconductor device 100 shown in FIGS. 1A to 1E, and also may be similar to the semiconductor device 300 shown in FIG. 5. Hereinafter, as for the detailed descriptions on the constituent elements also appearing in FIGS. 1A to 1E and FIG. 5, descriptions of FIGS. 1A to 1E and FIG. 5 may be referred to.

Referring to FIG. 8, the semiconductor device 400 may include a substrate 101, a buffer layer 102, a bit line 110, a barrier layer 111, an oxide semiconductor pillar 120, a tapered vertical word line 124, a gate dielectric layer 125, and a capacitor 130. The semiconductor device 400 may further include a first contact plug 126 and a second contact plug 127 between the oxide semiconductor pillar 120 and the capacitor 130. The oxide semiconductor pillar 120 may include a lower interface layer 122, an oxide semiconductor channel layer 121, and an upper interface layer 123. The lower interface layer 122, the oxide semiconductor channel layer 121, and the upper interface layer 123 may all include an oxide semiconductor material. The lower interface layer 122, the oxide semiconductor channel layer 121, and the upper interface layer 123 may all include IGZO, but the lower interface layer 122 and the upper interface layer 123 may have a higher indium concentration than the oxide semiconductor channel layer 121. The oxide semiconductor channel layer 121 may be IGZO, and the lower interface layer 122 and the upper interface layer 123 may be indium-rich IGZO.

The semiconductor device 400 may further include a dummy plate 210 below the bit line 110. The buffer layer 102 may be disposed between the dummy plate 210 and the bit line 110. According to another embodiment of the present invention, the dummy plate 210 may be omitted.

The semiconductor device 400 may further include an isolating dielectric layer 401 which is disposed between the tapered vertical word line 124 and the barrier layer 111. The isolating dielectric layer 401 may be disposed below the gate dielectric layer 125. The isolating dielectric layer 401 may further increase the distance between the lower level portion 124L of the tapered vertical word line 124 and the bit line 110 (refer to a reference numeral H1).

Referring to FIG. 9, the semiconductor device 410 may include a substrate 101, a buffer layer 102, a bit line 110, a barrier layer 111, an oxide semiconductor pillar 120, a tapered vertical word line 124, a gate dielectric layer 125, and a capacitor 130. The semiconductor device 410 may further include a first contact plug 126 and a second contact plug 127 between the oxide semiconductor pillar 120 and the capacitor 130. The oxide semiconductor pillar 120 may include a lower interface layer 122', an oxide semiconductor channel layer 121, and an upper interface layer 123. The lower interface layer 122', the oxide semiconductor channel layer 121, and the upper interface layer 123 may all include IGZO, but the lower interface layer 122' and the upper interface layer 123 may have a higher indium concentration than the oxide semiconductor channel layer 121. The oxide semiconductor channel layer 121 may be IGZO, and the lower interface layer 122' and the upper interface layer 123 may be indium-rich IGZO.

The semiconductor device 410 may further include a dummy plate 210 below the bit line 110. The buffer layer 102 may be disposed between the dummy plate 210 and the bit line 110. According to another embodiment of the present invention, the dummy plate 210 may be omitted.

The semiconductor device 410 may further include an isolating dielectric layer 401 which is disposed between the tapered vertical word line 124 and the barrier layer 111. The isolating dielectric layer 401 may further increase the distance between the lower level portion 124L of the tapered vertical word line 124 and the bit line 110 (refer to a reference numeral H1).

The height of the lower interface layer 122' of the oxide semiconductor pillar 120 may be greater than the height of the upper interface layer 123. Also, the height of the lower interface layer 122' may be greater than the height of the lower interface layer 122 of FIG. 8. The lower interface layer 122' and the isolating dielectric layer 401 may have the same height.

Referring to FIG. 10, the semiconductor device 420 may include a substrate 101, a buffer layer 102, a bit line 110, a barrier layer 111, an oxide semiconductor pillar 120, a tapered vertical word line 124, a gate dielectric layer 125, and a capacitor 130. The semiconductor device 420 may further include a first contact plug 126 and a second contact plug 127 between the oxide semiconductor pillar 120 and the capacitor 130. The oxide semiconductor pillar 120 may include a lower interface layer 122", an oxide semiconductor channel layer 121, and an upper interface layer 123. The lower interface layer 122", the oxide semiconductor channel layer 121, and the upper interface layer 123 may all include IGZO, but the lower interface layer 122" and the upper interface layer 123 may have a higher indium concentration than the oxide semiconductor channel layer 121. The oxide semiconductor channel layer 121 may be IGZO, and the lower interface layer 122" and the upper interface layer 123 may be indium-rich IGZO.

The semiconductor device 420 may further include a dummy plate 210 below the bit line 110. The buffer layer 102 may be disposed between the dummy plate 210 and the bit line 110. According to another embodiment of the present invention, the dummy plate 210 may be omitted.

The semiconductor device 420 may further include an isolating dielectric layer 401 which is disposed between the tapered vertical word line 124 and the gate dielectric layer 125. The isolating dielectric layer 401 may be disposed over the gate dielectric layer 125. The isolating dielectric layer 401 may further increase the distance between the lower level portion 124L of the tapered vertical word line 124 and the bit line 110 (refer to a reference numeral H1).

The height of the lower interface layer 122" of the oxide semiconductor pillar 120 may be greater than the height of the upper interface layer 123. The height of the lower interface layer 122" may be greater than the height of the lower interface layer 122' of FIG. 9. According to another embodiment of the present invention, the height of the lower interface layer 122" may be the same as the height of the lower interface layer 122' of FIG. 9. According to another embodiment of the present invention, the height of the lower interface layer 122" may be the same as the height of the lower interface layer 122 of FIG. 8.

In the semiconductor devices 400, 410, and 420 shown in FIGS. 8 to 10, the tapered vertical word line 124 and the bit line 110 may be spaced apart from each other by a sufficient distance due to the isolating dielectric layer 401 and the gate dielectric layer 125 (refer to a reference numeral H1). The isolating dielectric layer 401 may include silicon oxide.

The gate dielectric layer 125 of the semiconductor devices 400, 410, and 420 shown in FIGS. 8 to 10 may include a vertical portion 125V which is disposed between the oxide semiconductor pillar 120 and the tapered vertical word line 124, and a horizontal portion 125F which extends from the vertical portion 125V and is disposed between the bit line 110 and the tapered vertical word line 124. The isolating dielectric layer 401 may be disposed at a lower level than the horizontal portion 125F of the gate dielectric layer 125 (refer to FIGS. 8 and 9) or may be disposed at a higher level than the horizontal portion 125F of the gate dielectric layer 125 (refer to FIG. 10).

FIGS. 11A to 14B are examples of a method for fabricating the semiconductor devices in accordance with FIGS. 8 to 10.

Figure 11A:
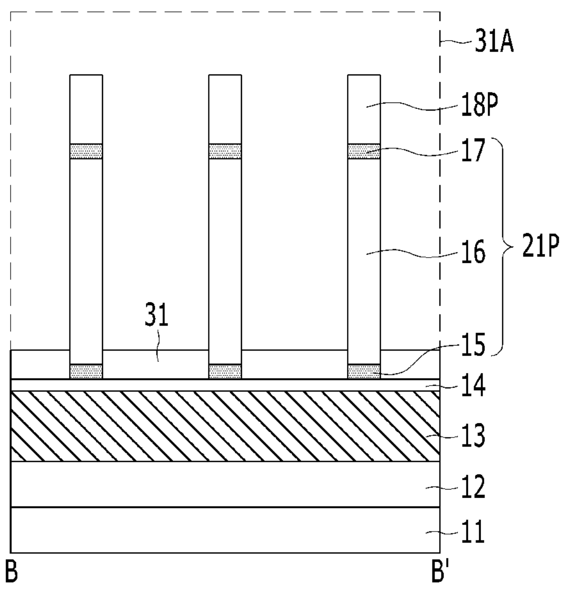
FIGS. 11A to 11C are cross-sectional views illustrating a method for fabricating a semiconductor device in accordance with another embodiment of the present invention.
Figure 11B:
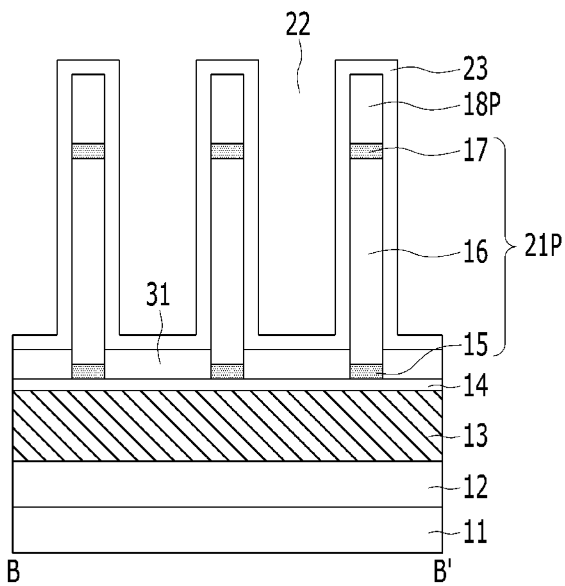
Figure 11C:
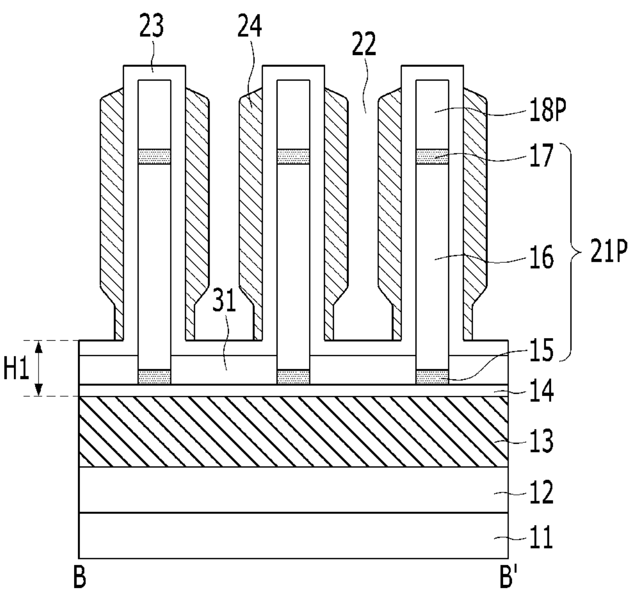

FIGS. 11A to 11C are cross-sectional views illustrating a method for fabricating a semiconductor device in accordance with another embodiment of the present invention. The method for fabricating the semiconductor device of FIGS. 11A to 11C may be similar to that of FIGS. 2A to 2K. Hereinafter, as for the detailed descriptions on the constituent elements also appearing in FIGS. 2A to 2K, descriptions of FIGS. 2A to 2K may be referred to. FIGS. 11A to 11C illustrate the fabrication method according to the line B-B' shown in FIG. 1A.

First, referring to FIGS. 2A to 2D, a buffer layer 12 may be formed over the substrate 11, and a bit line 13 and a barrier layer 14 may be formed over the buffer layer 12. Subsequently, oxide semiconductor pillars 21P including a lower interface layer 15, a channel layer 16, and an upper interface layer 17 may be formed over the barrier layer 14. Sacrificial pillars 18P may be disposed over the upper interface layer 17. Second trenches 22 may be formed between the oxide semiconductor pillars 21P.

Subsequently, referring to FIG. 11A, an isolating dielectric layer 31 may be formed over the barrier layer 14. The isolating dielectric layer 31 may be formed by depositing a dielectric layer 31A over the oxide semiconductor pillars 21P and then performing an etch-back process onto the dielectric layer 31A. The isolating dielectric layer 31 may include silicon oxide. The height of the isolating dielectric layer 31 may be greater than the height of the lower interface layer 15.

Referring to FIG. 11B, a gate dielectric layer 23 may be formed over the isolating dielectric layer 31. The gate dielectric layer 23 may be formed on the exposed sidewalls of the oxide semiconductor pillars 21P and the sacrificial pillars 18P. The isolating dielectric layer 31 may be disposed between the gate dielectric layer 23 and the bit line 13. The isolating dielectric layer 31 may be disposed at a lower level than the gate dielectric layer 23.

Referring to FIG. 11C, the tapered vertical word lines 24 may be formed. Tapered vertical word lines 24 may be formed with reference to the methods illustrated in FIGS. 2E to 2G. The gate dielectric layer 23, the isolating dielectric layer 31, and the barrier layer 14 may be disposed between the bottom portion of the tapered vertical word lines 24 and the bit line 13. The tapered vertical word lines 24 and the bit line 13 may be spaced apart from each other by a sufficient distance due to the isolating dielectric layer 31 and the gate dielectric layer 23 (refer to a reference numeral H1).

Figure 12A:
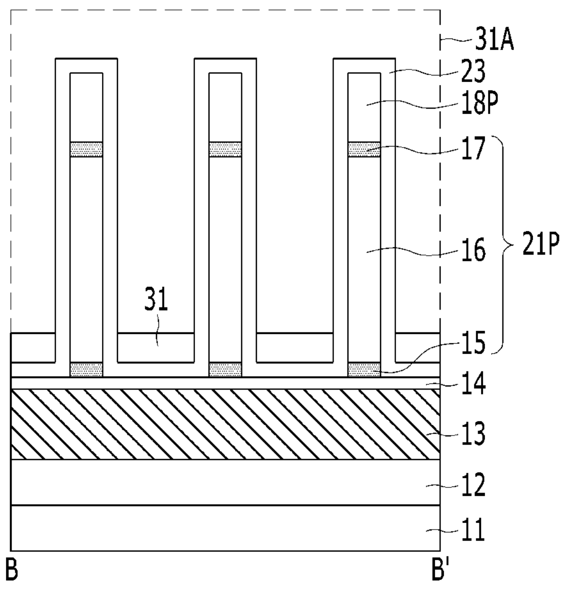
FIGS. 12A and 12B are cross-sectional views illustrating a method for fabricating a semiconductor device in accordance with another embodiment of the present invention.
Figure 12B:
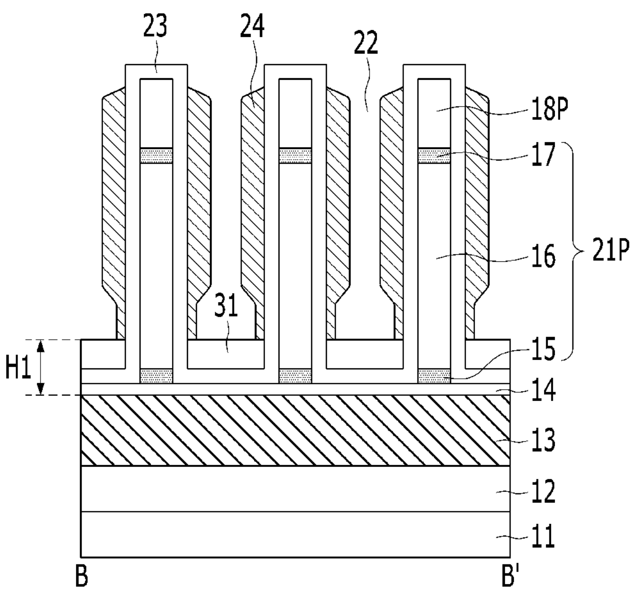

FIGS. 12A and 12B are cross-sectional views illustrating a method for fabricating a semiconductor device in accordance with another embodiment of the present invention. The method for fabricating the semiconductor device of FIGS. 12A and 12B may be similar to that of FIGS. 2A to 2K. Hereinafter, as for the detailed descriptions on the constituent elements also appearing in FIGS. 2A to 2K, descriptions of FIGS. 2A to 2K may be referred to. FIGS. 12A and 12B may be the fabrication method according to the line B-B' shown in FIG. 1A.

First, referring to FIGS. 2A to 2D, a buffer layer 12 may be formed over the substrate 11, and a bit line 13 and a barrier layer 14 may be formed over the buffer layer 12. Subsequently, oxide semiconductor pillars 21P including a lower interface layer 15, a channel layer 16, and an upper interface layer 17 may be formed over the barrier layer 14. Sacrificial pillars 18P may be disposed over the upper interface layer 17.

Subsequently, referring to FIG. 12A, a gate dielectric layer 23 may be formed over the barrier layer 14. The gate dielectric layer 23 may be formed on the exposed sidewalls of the oxide semiconductor pillars 21P and the sacrificial pillars 18P.

Subsequently, an isolating dielectric layer 31 may be formed over the gate dielectric layer 23. The isolating dielectric layer 31 may be formed by depositing a dielectric layer 31A over the gate dielectric layer 23 and performing an etch-back process onto the dielectric layer 31A. The isolating dielectric layer 31 may include silicon oxide. The height of the isolating dielectric layer 31 may be greater than the height of the lower interface layer 15. A gate dielectric layer 23 may be disposed between the isolating dielectric layer 31 and the bit line 13.

As described above, the isolating dielectric layer 31 may be formed after the gate dielectric layer 23 is formed.

Referring to FIG. 12B, tapered vertical word lines 24 may be formed. The tapered vertical word lines 24 may be formed with reference to the methods illustrated in FIGS. 2E to 2G. A gate dielectric layer 23, an isolating dielectric layer 31, and a barrier layer 14 may be disposed between the bottom portion of the tapered vertical word lines 24 and the bit line 13. The tapered vertical word lines 24 and the bit line 13 may be spaced apart from each other by a sufficient distance due to the isolating dielectric layer 31 and the gate dielectric layer 23 (refer to a reference numeral H1).

FIGS. 13A to 13D are cross-sectional views illustrating a method for fabricating a semiconductor device in accordance with another embodiment of the present invention. The method for fabricating the semiconductor device of FIGS. 13A to 13D may be similar to that of FIGS. 2A to 2K. Hereinafter, as for the detailed descriptions on the constituent elements also appearing in FIGS. 2A to 2K, descriptions of FIGS. 2A to 2K may be referred to. FIGS. 13A to 13D may be the fabrication method according to the line B-B' shown in FIG. 1A.

Figure 13A:
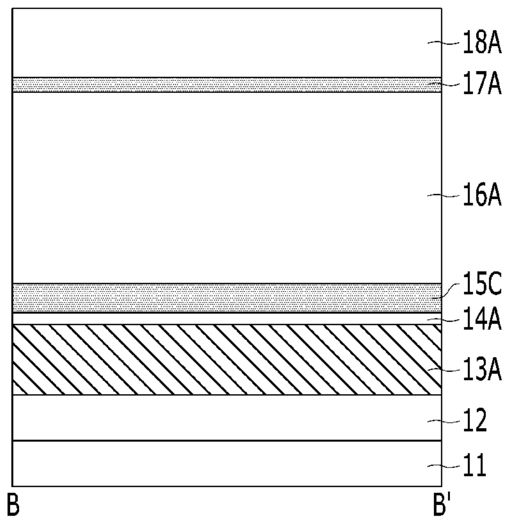
FIGS. 13A to 13D are cross-sectional views illustrating a method for fabricating a semiconductor device in accordance with another embodiment of the present invention.

Referring to FIGS. 2A and 13A, a buffer layer 12 may be formed over a substrate 11, and a conductive layer 13A and a barrier material layer 14A may be sequentially formed over the buffer layer 12.

A lower interface layer 15C may be formed over the barrier material layer 14A. The lower interface layer 15C may include a conductive material. The lower interface layer 15C may include an oxide semiconductor material. The lower interface layer 15C may contain indium. The lower interface layer 15C may include an indium-rich oxide semiconductor material. For example, the lower interface layer 15C may include indium-rich IGZO. The lower interface layer 15C may be formed to have a thickness of approximately 10 to 50 Å. The lower interface layer 15C may be thicker than the lower interface material layer 15A shown in FIG. 2A.

A channel material layer 16A may be formed over the lower interface layer 15C. The channel material layer 16A may include a conductive material. The channel material layer 16A may include an oxide semiconductor material. The channel material layer 16A may contain indium. The channel material layer 16A may include IGZO. The channel material layer 16A may be formed to have a thickness of approximately 200 to 1000 Å.

An upper interface material layer 17A may be formed over the channel material layer 16A. The upper interface material layer 17A may include a conductive material. The upper interface material layer 17A may include an oxide semiconductor material. The upper interface material layer 17A may contain indium. The upper interface material layer 17A may include an indium-rich oxide semiconductor material. For example, the upper interface material layer 17A may include indium-rich IGZO. The upper interface material layer 17A may be formed to have a thickness of approximately 10 to 50 Å. The upper interface material layer 17A may be thinner than the lower interface layer 15C.

As described above, the lower interface layer 15C, the channel material layer 16A, and the upper interface material layer 17A may be vertically stacked over the barrier material layer 14A. The lower interface layer 15C, the channel material layer 16A, and the upper interface material layer 17A may all include an oxide semiconductor material. The lower interface layer 15C, the channel material layer 16A, and the upper interface material layer 17A may all include IGZO, but the lower interface layer 15C and the upper interface material layer 17A may have a higher indium concentration than the channel material layer 16A. The channel material layer 16A may be IGZO, and the lower interface material layer 15A and the upper interface material layer 17A may be indium-rich IGZO. As the lower interface layer 15C and the upper interface material layer 17A contain a high concentration of indium, the resistance may be reduced lower than that of the channel material layer 16A. Also, channel seamless interconnection of the channel material layer 16A is possible.

Subsequently, a sacrificial layer 18A may be formed over the upper interface material layer 17A. The sacrificial layer 18A may include a stack of different materials. The sacrificial layer 18A may include silicon nitride.

Figure 13B:
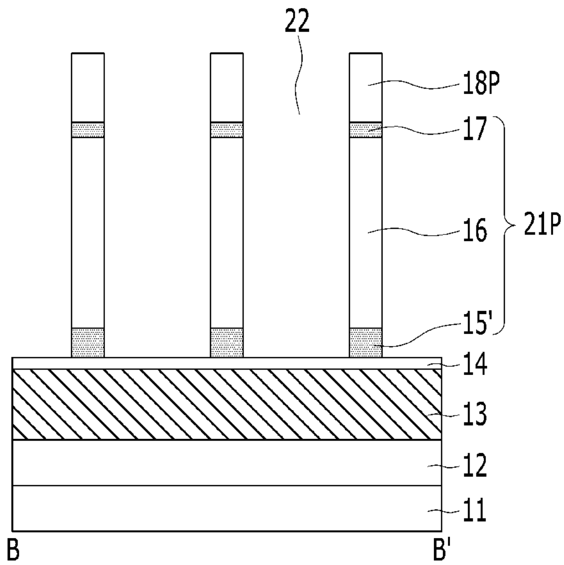

Referring to FIG. 13B, a bit line 13 and a barrier layer 14 may be formed over the buffer layer 12 by a series of the processes as illustrated in FIGS. 2B to 2D. Subsequently, oxide semiconductor pillars 21P including a lower interface layer 15', a channel layer 16, and an upper interface layer 17 may be formed over the barrier layer 14. Sacrificial pillars 18P may be disposed over the upper interface layer 17. Second trenches 22 may be formed between the oxide semiconductor pillars 21P.

Figure 13C:
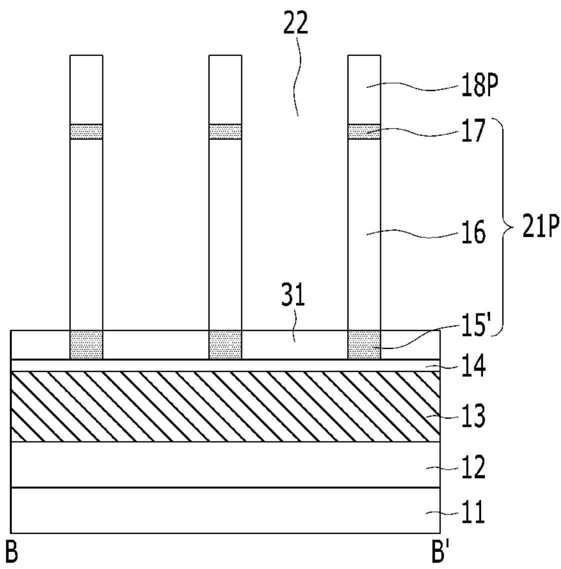

Referring to FIG. 13C, an isolating dielectric layer 31 may be formed over the barrier layer 14. A method of forming the isolating dielectric layer 31 may be the same as that of FIG. 11A. The height of the isolating dielectric layer 31 and the lower interface layer 15' may be the same as each other.

Figure 13D:
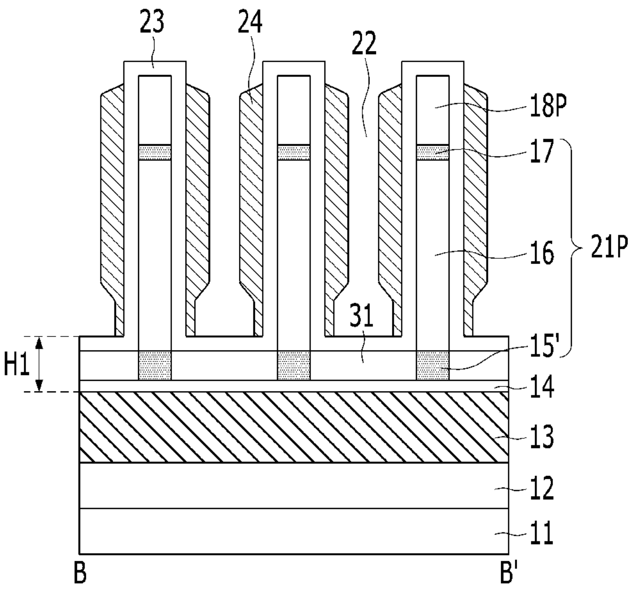

Referring to FIG. 13D, a gate dielectric layer 23 may be formed over the isolating dielectric layer 31, and tapered vertical word lines 24 may be formed over the gate dielectric layer 23. The tapered vertical word lines 24 may be formed with reference to the methods illustrated in FIGS. 2E to 2G. A gate dielectric layer 23, an isolating dielectric layer 31, and a barrier layer 14 may be disposed between the bottom portion of the tapered vertical word lines 24 and the bit line 13. The tapered vertical word lines 24 and the bit line 13 may be spaced apart from each other by a sufficient distance due to the isolating dielectric layer 31 and the gate dielectric layer 23 (refer to a reference numeral H1).

Figure 14A:
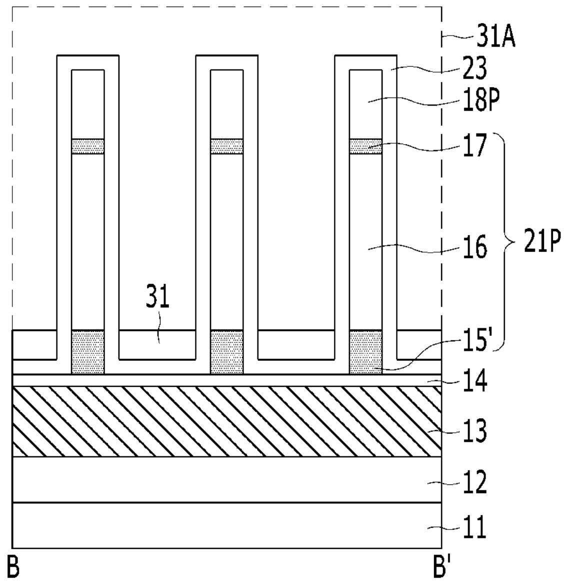
FIGS. 14A and 14B are cross-sectional views illustrating a method for fabricating a semiconductor device in accordance with another embodiment of the present invention.
Figure 14B:
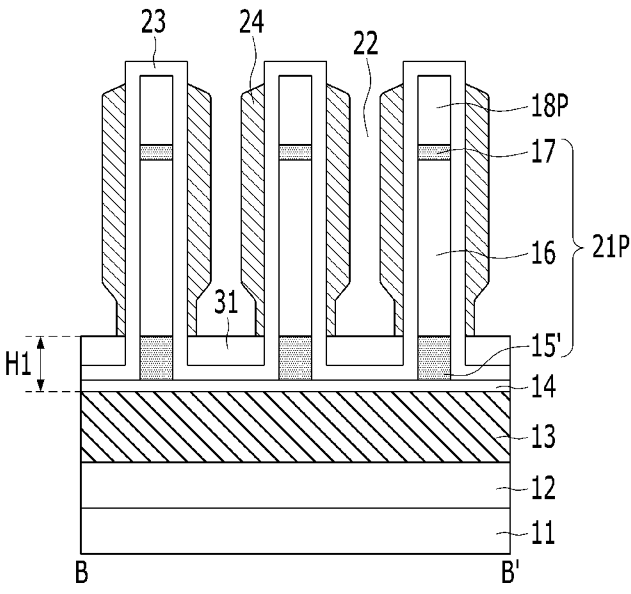

FIGS. 14A and 14B are cross-sectional views illustrating a method for fabricating a semiconductor device in accordance with another embodiment of the present invention. The method for fabricating the semiconductor device of FIGS. 14A and 14B may be similar to that of FIGS. 2A through 2K. Hereinafter, as for the detailed descriptions on the constituent elements also appearing in FIGS. 2A to 2K, descriptions of FIGS. 2A to 2K may be referred to. FIGS. 14A and 14B may be the fabrication method according to the line B-B' shown in FIG. 1A.

First, as illustrated in FIGS. 2A to 2D and 13A and 13B, a buffer layer 12 may be formed over the substrate 11, and a bit line 13 and a barrier layer 14 may be formed over the buffer layer 12. Subsequently, oxide semiconductor pillars 21P including a lower interface layer 15', a channel layer 16, and an upper interface layer 17 may be formed over the barrier layer 14. Sacrificial pillars 18P may be disposed over the upper interface layer 17.

Subsequently, referring to FIG. 14A, a gate dielectric layer 23 may be formed over the barrier layer 14. The gate dielectric layer 23 may be formed on the exposed sidewalls of the oxide semiconductor pillars 21P and the sacrificial pillars 18P.

Subsequently, an isolating dielectric layer 31 may be formed over the gate dielectric layer 23. The isolating dielectric layer 31 may be formed by depositing the dielectric layer 31A over the gate dielectric layer 23 and performing an etch-back process onto the dielectric layer 31A. The isolating dielectric layer 31 may include silicon oxide. The gate dielectric layer 23 may be disposed between the isolating dielectric layer 31 and the bit line 13.

As described above, the isolating dielectric layer 31 may be formed after the gate dielectric layer 23 is formed.

Referring to FIG. 14B, tapered vertical word lines 24 may be formed. The tapered vertical word lines 24 may be formed with reference to the methods shown in FIGS. 2E to 2G. The gate dielectric layer 23, the isolating dielectric layer 31, and the barrier layer 14 may be disposed between the bottom portion of the tapered vertical word lines 24 and the bit line 13. The tapered vertical word lines 24 and the bit line 13 may be spaced apart from each other by a sufficient distance due to the isolating dielectric layer 31 and the gate dielectric layer 23 (refer to a reference numeral H1).

According to the embodiment of the present invention, since a bit line and a transistor are sequentially formed by using a depositable channel material, procedural difficulty may be reduced.

According to the embodiment of the present invention, the degree of integration may be increased by stacking a memory cell array without wafer bonding, and the degree of integration may be improved through a peripheral-under-cell (PUC) structure where a memory cell array is formed over a peripheral circuit portion.

According to the embodiment of the present invention, a metal oxide, particularly IGZO, may be used as a channel material to suppress gate-induced drain leakage and junction leakage so as to improve retention characteristics.

The effects desired to be obtained in the embodiments of the present invention are not limited to the effects mentioned above, and other effects not mentioned above may also be clearly understood by those of ordinary skill in the art to which the present invention pertains from the description below.

While the present invention has been described with respect to the specific embodiments, it will be apparent to those skilled in the art that various changes and modifications may be made without departing from the spirit and scope of the invention as defined in the following claims.

What is claimed is:

1. A semiconductor device, comprising:

a bit line over a substrate;

an oxide semiconductor pillar extending vertically from and over a top surface of the bit line;

a first contact plug disposed over the oxide semiconductor pillar;

a second contact plug disposed over the first contact plug, the first contact plug having a top surface that is at least partially in contact with a bottom surface of the second contact plug;

a capacitor disposed over the second contact plug; and a word line comprising two separate word line structures having shapes that are symmetrical to each other, each word line structure being disposed over at least some sidewalls of the oxide semiconductor pillar and the first contact plug and under the second contact plug, wherein the oxide semiconductor pillar comprises:

a lower oxide semiconductor interface layer coupled to the bit line;

an upper oxide semiconductor interface layer coupled to the capacitor; and an oxide semiconductor channel layer disposed between the lower oxide semiconductor interface layer and the upper oxide semiconductor interface layer.

2. The semiconductor device of claim 1, wherein the word line structure has a tapered shape.

3. The semiconductor device of claim 1, wherein the word line structure includes an upper level portion disposed adjacent to the capacitor, and a lower level portion disposed adjacent to the bit line, and wherein the lower level portion is thinner than the upper level portion.

4. The semiconductor device of claim 1, wherein the bit line includes a metal material.

5. The semiconductor device of claim 1, further comprising:

a barrier layer disposed between the bit line and the lower oxide semiconductor interface layer.

6. The semiconductor device of claim 1, further comprising:

a buffer layer disposed between the bit line and the substrate.

7. The semiconductor device of claim 1, wherein each of the oxide semiconductor channel layer, the lower oxide semiconductor interface layer, and the upper oxide semiconductor interface layer includes an oxide semiconductor material, and wherein the lower oxide semiconductor interface layer and the upper oxide semiconductor interface layer include an oxide semiconductor material having a lower resistance than the oxide semiconductor channel layer.

8. The semiconductor device of claim 1, wherein the lower oxide semiconductor interface layer and the upper oxide semiconductor interface layer include a metallic-rich oxide semiconductor material having a greater metallic component than the oxide semiconductor channel layer.

9. The semiconductor device of claim 1, wherein the oxide semiconductor channel layer includes IGZO, ITZO or ZTO, and the lower oxide semiconductor interface layer and the upper oxide semiconductor interface layer include indium-rich IGZO, and the indium-rich IGZO includes IGZO with a greater content of indium than gallium and zinc.

10. The semiconductor device of claim 1, further comprising:

a dummy plate which is disposed at a lower level than the bit line, and wherein the dummy plate and the bit line are coupled to each other.

11. The semiconductor device of claim 1, wherein a height of the oxide semiconductor channel layer is greater than a height of the lower oxide semiconductor interface layer and a height of the upper oxide semiconductor interface layer.

12. The semiconductor device of claim 1, further comprising:

a gate dielectric layer disposed between the oxide semiconductor channel layer and each of the two separate word line structures, wherein the gate dielectric layer includes:

a vertical portion which is disposed between the oxide semiconductor channel layer and each of the two separate word line structures; and a horizontal portion which extends from the vertical portion and is disposed between the bit line and each of the two separate word line structures.

13. The semiconductor device of claim 1, further comprising:

a gate dielectric layer between the oxide semiconductor channel layer and each of the two separate word line structures; and an isolating dielectric layer between each of the two separate word line structures and the bit line, wherein the gate dielectric layer includes a horizontal portion extending to be disposed between each of the two separate word line structures and the bit line.

14. The semiconductor device of claim 13, wherein the isolating dielectric layer is disposed over or under the gate dielectric layer.

15. The semiconductor device of claim 13, wherein a height of the lower oxide semiconductor interface layer and a height of a horizontal portion of the isolating dielectric layer are greater than a height of the upper oxide semiconductor interface layer.

16. A semiconductor device, comprising:

a substrate;

a peripheral circuit portion disposed over the substrate; and a memory cell array including a bit line over the substrate, a transistor over the bit line, a second contact plug over the transistor, and a memory element that is vertically stacked over the peripheral circuit portion and the second contact plug, wherein the transistor comprises:

an oxide semiconductor channel layer disposed between the bit line and the memory element;

a first contact plug disposed over an upper oxide semiconductor interface layer, the first contact plug having a top surface that is at least partially in contact with a bottom surface of the second contact plug;

two separate tapered vertical word line structures having shapes that are symmetrical to each other, each tapered word line structure being disposed over at least some sidewalls of the oxide semiconductor channel layer and the first contact plug and under the second contact plug;

a lower oxide semiconductor interface layer disposed between the bit line and the oxide semiconductor channel layer; and the upper oxide semiconductor interface layer disposed between the memory element and the oxide semiconductor channel layer.

17. The semiconductor device of claim 16, wherein the tapered vertical word line structure includes:

an upper level portion disposed adjacent to the memory element, and a lower level portion disposed adjacent to the bit line and thinner than the upper level portion.

18. The semiconductor device of claim 16, wherein the bit line includes a metal material.

19. The semiconductor device of claim 16, wherein the lower oxide semiconductor interface layer and the upper oxide semiconductor interface layer include an oxide semiconductor material which has a lower resistance than the oxide semiconductor channel layer.

20. The semiconductor device of claim 16, wherein the oxide semiconductor channel layer includes IGZO, ITZO or ZTO, and the lower oxide semiconductor interface layer and the upper oxide semiconductor interface layer include indium-rich IGZO, and the indium-rich IGZO includes IGZO with a greater content of indium than gallium and zinc.

21. A semiconductor device, comprising:

a first conductive line over a substrate;

an oxide semiconductor pillar extending vertically from and over a top surface of the first conductive line;

a first contact plug disposed over the oxide semiconductor pillar;

a second contact plug disposed over the first contact plug, the first contact plug having a top surface that is at least partially in contact with a bottom surface of the second contact plug;

a capacitor disposed over the second contact plug; and two separate second tapered conductive lines having shapes that are symmetrical to each other, each second tapered conductive line being disposed over at least some sidewalls of the oxide semiconductor pillar and the first contact plug and under the second contact plug, wherein the oxide semiconductor pillar comprises:

a lower oxide semiconductor interface layer coupled to the first conductive line;

an upper oxide semiconductor interface layer coupled to the capacitor; and an oxide semiconductor channel layer disposed between the lower oxide semiconductor interface layer and the upper oxide semiconductor interface layer.

* * * * *